United States Patent [19]
Tang et al.

[11] Patent Number: 5,294,869
[45] Date of Patent: * Mar. 15, 1994

[54] ORGANIC ELECTROLUMINESCENT MULTICOLOR IMAGE DISPLAY DEVICE

[75] Inventors: Ching W. Tang, Rochester; Jon E. Littman, Honeoye Falls, both of N.Y.

[73] Assignee: Eastman Kodak Company, Rochester, N.Y.

[*] Notice: The portion of the term of this patent subsequent to Jan. 4, 2011 has been disclaimed.

[21] Appl. No.: 814,163

[22] Filed: Dec. 30, 1991

[51] Int. Cl.$^5$ .......................................... H05B 33/14
[52] U.S. Cl. ............................. 313/504; 313/505; 313/500; 340/781; 428/917
[58] Field of Search ............... 313/489, 486, 487, 500, 313/504, 505, 506, 509; 428/690, 917; 340/781; 315/169.3, 169.1

[56] References Cited

U.S. PATENT DOCUMENTS

| | | | |
|---|---|---|---|
| 3,180,730 | 4/1965 | Klupfel et al. | 96/1 |
| 3,567,450 | 3/1971 | Brantly et al. | 96/1.5 |
| 3,935,031 | 1/1976 | Adler | 136/206 |
| 4,175,960 | 11/1979 | Berwick et al. | 430/58 |
| 4,356,429 | 10/1982 | Tang | 313/503 |
| 4,446,399 | 5/1984 | Endo et al. | 313/505 |
| 4,539,507 | 9/1985 | VanSlyke et al. | 313/504 |
| 4,720,432 | 1/1988 | VanSlyke et al. | 428/457 |
| 4,769,292 | 9/1988 | Tang et al. | 428/690 |
| 4,885,211 | 12/1989 | Tang et al. | 428/457 |
| 4,950,950 | 8/1990 | Perry et al. | 313/504 |
| 4,999,539 | 3/1991 | Coovert et al. | 313/505 |
| 5,047,687 | 9/1991 | VanSlyke | 313/503 |
| 5,059,861 | 10/1991 | Littman et al. | 313/503 |
| 5,059,862 | 10/1991 | VanSlyke et al. | 313/503 |
| 5,061,569 | 10/1991 | VanSlyke et al. | 428/457 |
| 5,061,617 | 10/1991 | Maskasky | 430/569 |
| 5,073,446 | 12/1991 | Scozzafava et al. | 428/323 |
| 5,150,006 | 9/1992 | VanSlyke et al. | 313/503 |
| 5,151,629 | 9/1992 | VanSlyke et al. | 313/504 |

FOREIGN PATENT DOCUMENTS 349265 1/1990 European Pat. Off. ..... H05B 33/26

OTHER PUBLICATIONS

Norbert A. Lange, Lange's Handbook of Chemistry, 12th Ed., McGraw Hill, 1979 Table 3-12, pp. 3-13-4-3-138.

Primary Examiner—Donald J. Yusko
Assistant Examiner—Ashok Patel
Attorney, Agent, or Firm—Raymond L. Owens

[57] ABSTRACT

A multicolor image display device includes an array consisting of a plurality of light emitting pixels arranged in two intersecting sets of parallel files, the pixels in a first set of parallel files forming columns and the pixels in a second set of parallel files forming rows on a common electrically insulative light transmissive support. The pixels in each file of one of the first or second set of parallel files contain and are joined by a common light transmissive first electrode overlying and laterally spaced on the support; an organic electroluminescent medium overlies the first electrode, and the pixels in each file of the other of the first or second set of parallel files contain and are joined by a laterally spaced common second electrode. The device, which is capable of producing multicolor image display, is further characterized in that each pixel in the first set of parallel files is divided into at least two sub-pixels, the electroluminescent medium in each of the sub-pixels being capable of emitting light of a different hue; parallel walls of a height exceeding the thickness of the electroluminescent medium and capable of shadowing adjacent sub-pixels are positioned between the sub-pixels, and each of the sub-pixels contains and is joined by an element of the first or second electrode.

15 Claims, 10 Drawing Sheets

2

ORGANIC ELECTROLUMINESCENT MULTICOLOR IMAGE DISPLAY DEVICE

FIELD OF THE INVENTION

The invention is directed to an organic electroluminescent image display device and to a process for its fabrication.

RELATED PATENT APPLICATION

Tang U.S. Ser. No. 07/814,553, filed concurrently herewith and commonly assigned, titled ORGANIC ELECTROLUMINESCENT IMAGE DISPLAY DEVICE AND PROCESS FOR ITS FABRICATION, discloses a device and a process for its preparation in which walls are interposed between a support and an organic EL medium to create a pattern of overlying electrodes.

PRIOR ART

Scozzafava EP 349,265 (a patent application published by the European Patent Office on Jan. 3, 1990) discloses an organic electroluminescent image display device and a process for its fabrication.

Scozzafava discloses a glass support bearing a series of laterally spaced, parallel indium tin oxide anode strips. An organic electroluminescent medium overlies the anode strips. Laterally spaced, parallel cathode strips, orthogonally oriented relative to the anode strips, are formed over the organic electroluminescent medium by depositing cathode forming metal as a continuous layer followed by patterning. Patterning of the cathode layer into cathode strips is achieved by spin coating a solution of monomeric negative-working photoresist in 2-ethoxyethanol solvent. The photoresist is imagewise exposed to UV radiation to produce a pattern of crosslinking, and uncrosslinked photoresist is removed by dipping the array in 2-ethoxyethanol for a few seconds. This removes unexposed photoresist and uncovers areas of the cathode layer. The uncovered areas of the cathode layer are removed by dipping the array in an acid etch bath consisting of 1000:1 water:sulfuric acid solution. After producing the cathode strips by this procedure, the array is rinsed in water and spun to remove excess water.

PROBLEM TO BE SOLVED

Organic electroluminescent devices that emit light in response to an applied voltage and cease to emit light when the applied voltage is removed constructed with an anode and cathode that are each unitary elements can be turned on and turned off, but lack an image display capability when used alone. When an organic electroluminescent device is given an image display capability by patterning each of the anode and cathode into parallel strips that are relatively orthogonally oriented, the problem arises that the electrode element that overlies the organic electroluminescent medium must be patterned after it is deposited. When this is undertaken by conventional wet chemistry patterning techniques, specifically illustrated by Scozzafava, either or both the performance and useful operating life of the imaging display is degraded as compared to a similar organic electroluminescent device having a unitary cathode and anode. Both organic electroluminescent medium and cathode degradation has been observed.

A second problem which the present invention overcomes is that employing an arrangement of the type disclosed by Scozzafava et al produces only a monochromatic image. In other words, all of the pixels that luminesce appear of the same hue. An image display is then limited to the patterns that can be produced by stimulating selected pixels to luminesce while intentionally failing to stimulate other pixels.

SUMMARY OF THE INVENTION

In one aspect the invention is directed to a light emitting device comprised of an image display array consisting of a plurality of light emitting pixels arranged in two intersecting sets of parallel files, the pixels in a first set of parallel files forming columns and the pixels in a second set of parallel files forming rows. The pixels are each located on a common electrically insulative light transmissive support. Each pixel in the same file of one set of parallel files contains and is joined by a common light transmissive first electrode means located on the support. The first electrode means in adjacent files of the one set is laterally spaced on the support. An organic electroluminescent medium overlies the first electrode means. Each pixel in the same file of the remaining set of parallel files contains and is joined by a common second electrode means located on the organic electroluminescent medium, and the second electrode means in adjacent files of the remaining set being laterally spaced on the organic electroluminescent medium.

The light emitting device is characterized in that it is capable of multicolor image display. The organic electroluminescent medium in each pixel forms at least two sub-pixel areas each capable of emitting light of a different hue, each pixel contains a wall positioned along a boundary separating two sub-pixel areas, the wall being of a height exceeding the thickness of the organic electroluminescent medium and capable of shadowing an adjacent sub-pixel area, and in each file of pixels of a selected set one of said first and second electrode means is divided into at least two laterally spaced elements each joining sub-pixel portions of the electroluminescent medium within the same file.

In another aspect the invention is directed to a process of preparing a light emitting device comprised of an image display array consisting of a plurality of pixels arranged in two intersecting sets of parallel files, the pixels in a first set of parallel files forming columns and the pixels in a second set of parallel files forming rows, the pixels each being located on a common electrically insulative light transmissive support, each pixel in the same file of one set of parallel files containing and being joined by a common light transmissive first electrode means located on the support, the first electrode means in adjacent files of the one set being laterally spaced on the support, an organic electroluminescent medium overlying the first electrode means, each pixel in the same file of the remaining set of parallel files containing and being joined by a common second electrode means located on the organic electroluminescent medium, and the second electrode means in adjacent files of the remaining set being laterally spaced on the organic electroluminescent medium, comprising (a) providing the support with the laterally spaced first electrode means on its surface, (b) depositing the organic electroluminescent medium on the supporting surface, and (c) forming the second electrode means on the surface of the organic electroluminescent medium.

The process is characterized in that the image display array is fabricated with a multicolor display capability by the steps of (i) forming on the support over the laterally spaced first electrode means prior to depositing the organic electroluminescent medium a set of parallel walls, (ii) orienting a first source for the vapor deposition of a first portion of the organic electroluminescent medium relative to the support surface at an angle that interposes each wall between the source and an adjacent portion of the surface of the support, the first portion of the organic electroluminescent medium being selected to impart electroluminescence of a first hue in the visible spectrum, (iii) selectively depositing the first portion of the electroluminescent medium on the surface of the support in areas other than those in which the walls are interposed between the source and the surface of the support, (IV) depositing a second portion of the electroluminescent medium on the surface of the support in areas of the support surface that are free of the first portion of the electroluminescent medium, the second portion of the electroluminescent medium being selected to impart electroluminescence of a second hue differing from each of the first hue, and (v) forming each of the electrode means joining one set of files as at least first and second laterally spaced electrode elements, the first electrode element in each file joining areas of the pixels in the same file that contain the first portion of the electroluminescent medium and the second electrode element in each file joining areas of the pixels that do not contain the first portion of the electroluminescent medium.

An advantage of the invention is that the organic electroluminescent devices of the invention having an image display capability can exhibit operating characteristics comparable to those of otherwise similar organic electroluminescent devices lacking an image display capability. A further important advantage of the invention is that the devices of the invention exhibit a multicolor image display capability absent from other conventional organic electroluminescent display devices, such as those of Scozzafava et al, cited above.

The processes of the invention by which the image display organic electroluminescent devices are fabricated offer the advantage that both the electroluminescent medium and the electrodes overlying the electroluminescent medium can be initially deposited in their desired pattern. Hence removal of either electroluminescent medium or electrode metal to form the desired pattern of elements and the disadvantages attendant such procedures are entirely eliminated.

Since device feature dimensions such as layer thicknesses are frequently in sub-micrometer ranges, the drawings are scaled for ease of visualization rather than dimensional accuracy.

DESCRIPTION OF PREFERRED EMBODIMENTS

The acronym EL is in some instances employed for the term "electroluminescent". The term "pixel" is employed in its art recognized usage to designate an area of an image display array that can be stimulated to luminesce independently of other areas. The term "multicolor" is employed to describe image display arrays that are capable of emitting light of a different hue in different areas (sub-pixels) of the same pixel. The term "full color" is employed to describe multicolor image display arrays that are capable of luminescing in the red, green and blue regions of the visible spectrum in different areas (sub-pixels) of a single pixel. The term "file" is employed to designate a row or column. The term "hue" refers to the intensity profile of light emission within the visible spectrum, with different hues exhibiting visually discernable differences in color.

Figure 1:
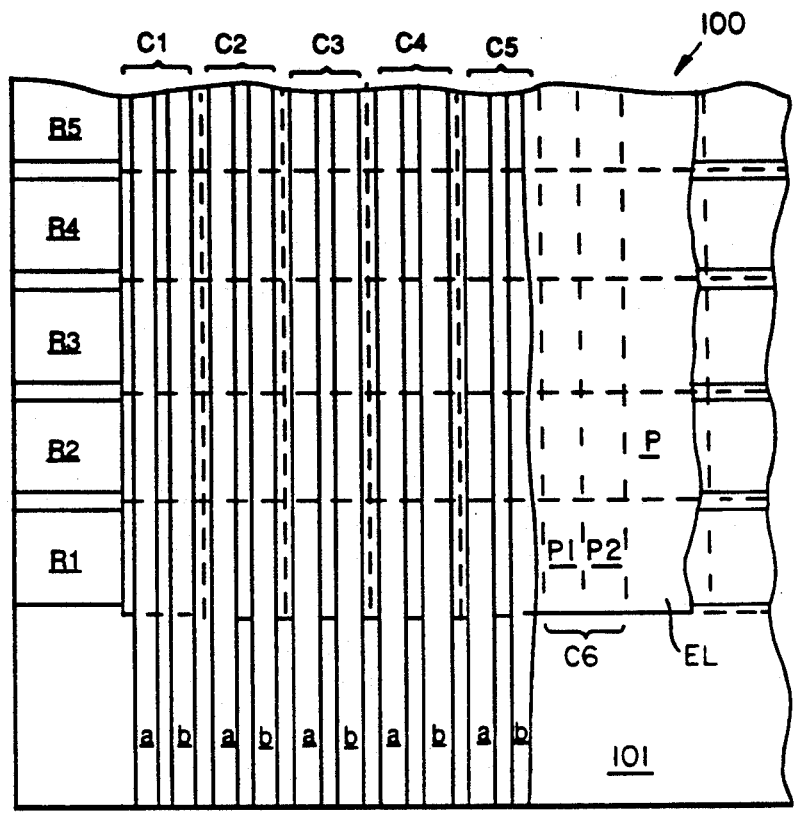
FIG. 1 is a plan view with portions broken away of a first embodiment of the invention.

Referring to FIG. 1, a portion of an organic EL device 100 is shown capable of producing a multicolor image. The upper surface of a light transmissive, preferably transparent, electrically insulative support 101 is shown bearing a series of light transmissive, preferably transparent, first electrodes R1, R2, R3, R4 and R5. The first electrodes are laterally spaced on the support surface for electrical isolation in parallel rows. In contact with and overlying all but the left most extremities of the first electrodes is an organic EL medium EL. Overlying the organic EL medium is a series of second electrodes C1, C2, C3, C4 and C5 arranged in parallel columns that are laterally spaced one from the other. The second electrodes extend laterally beyond the lower (as shown in FIG. 1) edge of the organic EL medium onto the lower portion of the support. In each column the electrode is divided into two parallel laterally spaced elements a and b. While in practice the device can (and in almost every instance will) have a much larger areal extent than shown, the portion of the device shown is sufficient to demonstrate its essential structure.

A grid of intersecting dashed lines are shown in FIG. 1 marking the boundaries of a series of pixels P. The pixels are arranged in an array of two intersecting sets of files. One set of files extends horizontally as shown in FIG. 1 and forms rows while the second set of files extends vertically as shown in FIG. 1 and forms columns. The lower row of pixels in FIG. 1 each overlie the first electrode R1, and each successive row of pixels overlies one of the successive first electrodes R2, R3, R4 and R5.

Proceeding from left to right in FIG. 1, a first column of the pixels share the common overlying second electrode C1 and successive columns of pixels similarly share successive second electrodes. A column of pixels C6 is shown in an area where overlying second electrodes have been broken away for ease of viewing. In column C6 the pixels are shown to be further divided into sub-pixels P1 and P2. In fact, each column of pixels is similarly divided, although, for ease of viewing, this detail is not indicated in each pixel. The sub-pixels P1 in each column include the overlying a element of each second electrode while the sub-pixels P2 in each column include the overlying b element of each second electrode. The sub-pixels P1 and P2 differ in that they emit light of a differing wavelength intensity profile and are therefore different in hue. For example, sub-pixels P1 may be chosen to emit primarily one primary color (i.e., blue, green or red) while the sub-pixels may be chosen to emit one of the other primary colors.

In operation a selected pattern of light emission from the device 100 is produced that can be seen by viewing the bottom surface of the transparent support 101. In a preferred mode of operation the device is stimulated to emit by sequentially stimulating one row of pixels at a time and repeating the stimulating sequence at a rate chosen so that the interval between repeated stimulations of each row is less than the detection limit of the human eye, typically less than about 1/60th of a second. The viewer sees an image formed by emission from all stimulated rows, even though the device at any instant is emitting light from only one row.

To create the desired image pattern, the a and b elements of each of the second electrodes are independently electrically addressed while the first electrode R1 is electrically biased to support emission. If, for example, only the emission hue of the sub-pixels P1 is wanted and that in only the columns including second electrodes C2, C3 and C4, the a elements in these columns are biased to support emission while the remaining second electrode elements are not electrically biased or given a bias of a polarity opposite that required to support emission. Immediately following emission in the desired pattern from the row of pixels joined by first electrode R1, a new pattern of stimulation is supplied to the second electrode elements, and the first electrode element R2 is next biased to stimulate the desired pattern of emission from the row of pixels it joins.

In fabricating the device 100 the first step is to provide the upper surface of the support 101 with the first electrodes R1, R2, R3, R4 and R5 in the pattern shown in FIG. 1. The most common choice is a glass support coated with indium tin oxide. Photoresist patterning followed by etching of the unprotected indium tin oxide areas with hydroiodic acid followed in turn by photoresist removal and rinsing provides the desired pattern of first electrodes. Instead of employing indium tin oxide, tin oxide or a similar electrically conductive transparent oxide, the first electrode elements can be formed of thin, light transmissive layers of any of the high (e.g., greater than 4.0 eV) work function metals. Chromium and gold mixtures are particularly contemplated for forming the first electrodes. The support and first electrodes possess a high degree of chemical stability, allowing photolithography to be conducted over their surfaces in subsequent fabrication steps without degradation.

Figure 2:
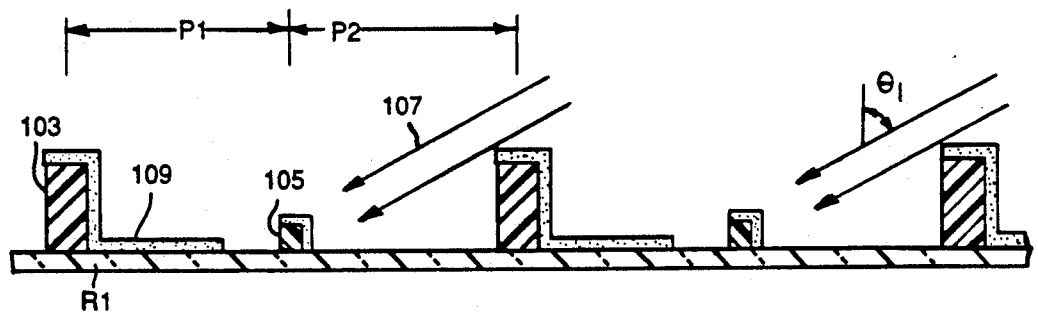
FIGS. 2, 3 and 4 are sectional schematic diagrams of two pixels of the first embodiment of the invention at successive stages of fabrication.
Figure 3:
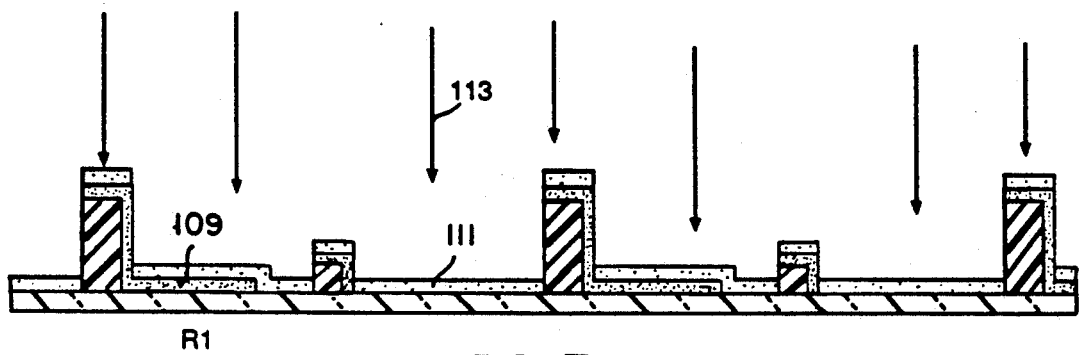
Figure 4:
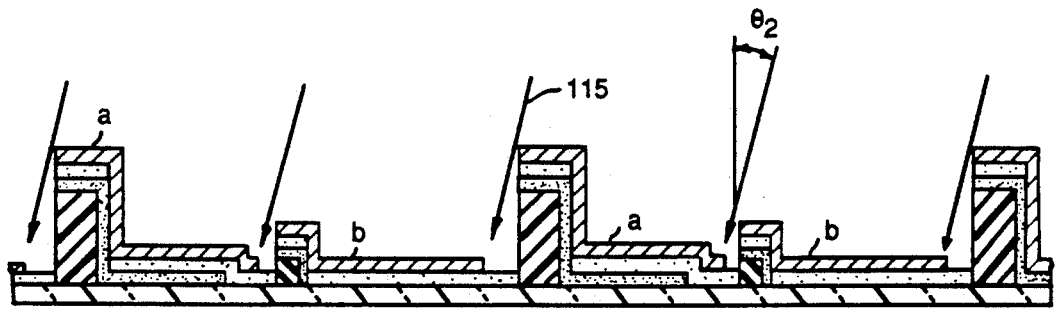

Successive stages of fabrication of the device 100 are shown in FIGS. 2 to 4 inclusive. A series of first walls 103 intended to form parallel pixel column boundaries are formed over the upper surface of the support and the first electrodes. In these figures the walls are shown at their intersection with the first electrode R1. In a simple, specifically preferred technique the walls 103 are formed by spin coating a negative working photoresist onto the deposition surface. The spin coating procedure can be repeated after drying to increase the thickness of the photoresist layer, if desired. Patterned exposure crosslinks the photoresist to an insoluble form in exposed areas while unexposed areas can be removed by development and washing techniques. Crosslinking by exposure produces strong, relatively rigid walls.

Numerous alternative wall forming techniques are possible. Instead of building up a thick photoresist layer by successive spin coating steps, thicker photoresist layers can be formed on the support by laminating a photoresist coating on a flexible support, such as transparent film, to the supporting surface. In this form the photoresist is typically a monomer that is polymerized by imagewise exposure following lamination. After imagewise exposure stripping the film also removes the monomer in areas that are not exposed.

In another wall forming technique the photoresist does not form the walls, but defines the wall pattern by its presence in areas surrounding the walls on the supporting surface. Photoresist layer formation can take any of the forms described above, but imagewise exposure is chosen to leave the photoresist in the areas surrounding the walls. Either a positive or negative working photoresist can be employed. Subsequently a wall forming material, such as silica, silicon nitride, alumina, etc., is deposited uniformly so that it overlies the photoresist where present and is deposited on the deposition surface in wall areas. After the walls are formed, the photoresist can be removed by any convenient conventional technique—e.g. solvent lift-off.

After forming the first walls 103 at the column boundaries of pixel areas, a set of parallel second walls 105 are formed at the boundary centrally dividing each column of pixels into sub-pixels. Since the second walls are lower in height than the first walls, they are formed in a separate fabrication sequence, either before or after forming the first walls. Any one of the techniques described above for forming the first walls can, with adjustments to reflect differing wall heights, be used to form the second walls. The second walls are preferably formed by a single spin casting of a negative working photoresist.

With the walls in place it is now possible to form the organic EL medium and second electrode element portions of the device in their desired patterns without resort to wet chemistry for removing materials and thus degrading the efficiency and/or stability of the device. The first patterning objective is to deposit a portion of the organic EL medium responsible for a first hue of emission over the first electrodes in the P1 sub-pixel areas. This is accomplished by the vapor phase deposition of the organic EL medium material from the direction indicated by the arrows 107. To accomplish deposition as shown the surface of the support is oriented in relation to a source of the organic EL medium (not shown) so that the walls 103 are interposed between the source and the portion of the first electrodes lying in the sub-pixels P2. The useful areas 109 of the deposited organic EL medium overlie the first electrodes in sub-pixels P1. The organic EL medium that is deposited on the sides of the walls does not contribute to luminescence and is inactive.

Any convenient conventional directional (line of sight) deposition technique can be employed. Transport of the organic medium is preferred in a vapor phase through a reduced pressure atmosphere to increase the mean free path of vapor phase atoms, thereby minimizing scattering and maintaining deposition in a directionally controlled manner. Generally the pressure of the ambient atmosphere during deposition is reduced so that the spacing between the source and the intended deposition surface is less than the mean free travel path of the organic EL medium molecules (that is, less than the distance an organic EL medium molecule travels on average before striking another vapor phase molecule). Conventional deposition techniques compatible with the directional transport requirements include any form of molecular beam deposition—e.g., vacuum vapor deposition, electron beam deposition, or laser ablation.

The next step of the fabrication process is to deposit a second portion of the organic EL medium responsible for a second hue of emission over the first electrodes in the P2 sub-pixel areas. The useful areas 111 of the second portion of the organic EL medium are the areas of the sub-pixels P2 that did not receive the first portion of the organic EL medium. Hence the desired pattern of second hue emission has already been defined by the deposition of the first portion of the organic EL medium, allowing the second portion of the organic EL medium to be uniformly deposited over all surfaces, as indicated by arrows 113. Deposition can be from a direction normal to the upper support surface or can be done in a non-directional manner. In areas in which the first portion of the organic EL medium overlies the first electrodes and the second portion of the organic EL medium overlies the first portion the hue of emission is controlled entirely by the first portion of the organic EL medium and is not significantly different than that which occurs when the second portion of the organic EL medium is absent. The portion of the organic EL medium that is nearest the first electrode controls the hue of emission.

Following deposition of the organic EL medium, a source is provided for the metals used for deposition of the second electrode elements. For efficient organic EL devices the second electrode elements require metal having a lower (less than 4.0 eV) work function to be in contact with the organic EL medium. One or more low work function metals alone or combination with one or more higher work function metals can be deposited on the organic EL medium by any convenient directional (i.e., line of sight) transport technique. To insure linear transport from their source to the organic EL medium surface the metal atoms are preferably transported through a reduced pressure atmosphere. Generally the same considerations apply as those described above for the directional deposition of the organic EL medium. Any convenient conventional directional deposition technique can be employed. In addition those deposition techniques mentioned above in connection with directional deposition of the organic EL medium, the metal can be directionally deposited by ion beam deposition or sputtering. Directional deposition of metal is shown in FIG. 4 by arrows 115.

To achieve a deposition pattern of the second electrode elements in laterally spaced pairs a and b as shown in FIG. 1 the surface of the support is positioned in relation to the source of metal to be deposited so that each wall is interposed between the source and an adjacent portion of the surface of the organic EL medium. When deposition is undertaken in such an orientation the interposed portions of the walls intercept metal traveling from the source, thereby preventing metal deposition on the organic EL medium on one side of each wall. This provides the spacing between adjacent elements of the second electrodes.

Note that the angle $\theta_2$ employed for metal deposition is significantly less than the angle $\theta_1$ employed for deposition of the organic EL medium. The angle $\theta_1$ is chosen to insure shadowing of an entire sub-pixel width, whereas the smaller angle $\theta_2$ need only be sufficient to achieve lateral electrical isolation of adjacent second electrode elements.

Deposition of low (<4.0 eV) work function metal, alone or in combination of one or more higher work function metals, requires only that a continuous layer containing the low work function metal be deposited to achieve maximum efficiency of electron injection into the organic EL medium. However, it is preferred to increase the thickness of the second electrodes beyond the 200 to 500 Å thickness levels contemplated to provide a continuous layer. Although thick electrodes of up to 1 μm or even higher can be formed using the original metal composition, it is generally preferred to switch deposition after initial formation of continuous layers containing low work function metal so that only relatively higher work function (and hence less chemically reactive) metals are deposited. For example, an initial continuous layer of magnesium (a preferred low work function metal) and silver, indium or aluminum would preferably be increased in thickness for the purpose of reducing second electrode element resistance by depositing a convenient higher work function metal commonly used in circuit fabrication, such as gold, silver, copper and/or aluminum. The combination of a lower work function metal at the interface of the organic EL medium and a higher work function metal completing the thickness of the overlying second electrode elements is particularly advantageous, since the higher electron injection efficiencies produced by a lower work function metal are fully realized even though the lower work function metal is limited to the second electrode element interface with the organic EL medium while the presence of the higher work metal increases the stability of the second electrode elements. Hence, a combination of high injection efficiency and high electrode element stability is realized by this arrangement.

In the foregoing description the organic EL medium is described in its simplest possible form. That is, the first portion 109 and second portion 111 of the organic EL medium can take any of the various conventional forms used to construct conventional devices containing a single organic EL medium layer. More efficient operation is realized when the organic EL medium in each active sub-pixel area contains superimposed layers. In efficient conventional multilayer organic EL devices a hole injecting and transporting zone is coated over a hole injecting electrode and is in turn overcoated with an electron injecting and transporting zone, which is in turn overcoated by an electron injecting electrode. For higher efficiencies the hole injecting and transporting zone can be further sub-divided into a hole injecting layer in contact with the hole injecting electrode and a hole transporting layer overlying the hole injecting layer. The electron injecting and transporting zone contains a luminescent layer contacting the hole injecting and transporting zone. In at least one set of sub-pixels the luminescent layer can form the entire electron injecting and transporting zone. In other sub-pixel areas the material forming the luminescent layer in an adjacent set of sub-pixels overlies a layer formed of a different luminescent material, with the overlying material, being separated from the hole injecting and transporting zone, not directly receiving holes and hence not contributing to luminescence. In still another variation a material forming a luminescent portion of the electron injecting and transporting zone can be overcoated with a more efficient electron transporting material. Thus, two, three, four or even more layer sequences of organic EL medium are commonly present in these more efficient organic EL devices.

In applying these conventional organic EL medium layer sequences to the practice of this invention each layer other than one layer from which luminescence occurs can be deposited uniformly. For example, to construct an organic EL device in which a hole injecting and transporting zone underlies a luminescent layer the organic EL medium forming the hole injecting and transporting zone is first deposited uniformly over the first electrode R1 by nondirectional deposition or normal deposition (the direction of arrows 113). The first and second portions 109 and 111 of the organic EL medium are then deposited as shown in FIGS. 2 and 3 over the uniformly deposited hole injecting and transporting zone. Luminescence of two different hues still occurs from the first and second portions, except that the efficiency of the device is improved by the presence of the hole injecting and transporting zone interposed between the portions 109 and 111 and the first electrodes. Further improvement in the organic EL device can be achieved by uniformly coating an electron injecting layer over the active portions 109 and 111 prior to depositing the second electrode elements a and b.

Even when the organic EL medium is formed of superimposed layers to achieve higher efficiencies the thickness of the organic EL medium is in all instances less than 1 $\mu$m and, more typically, less than 5000 Å. The individual layers of the organic EL medium can exhibit thicknesses as low as 50 Å while achieving satisfactory device performance. It is generally preferred that individual layers of the organic EL medium have a thickness in the range of from 100 to 2000 Å and that the overall thickness of the organic EL medium be at least 1000 Å.

The walls 103 and 105 are each of a height that exceeds the overall thickness of the organic EL medium. The sole function of the walls 105 is to provide a lateral separation between the second electrode elements a and b. Therefore the height of the walls 105 is usually chosen to be a convenient minimum for the wall formation technique employed. For walls 105 formed from a spin on photoresist coating a convenient height is typically in the range of from about 1 to 10 $\mu$m and typically from about 2 to 20 times the overall thickness of the organic EL medium. A spacing of the second electrode elements a and b that reliably electrically separates these electrodes along the walls 105 can be achieved by employing $\theta_2$ addressing angles that are preferably in the range of from 5° to 20°. Larger values of $\theta_2$ also provide reliable spacing, but are generally not preferred, since they reduce the active area emission area within each pixel to the extent that the spacing between the adjacent second electrode elements a and b within the same pixel is increased beyond the minimum required spacing for electrical isolation.

The preferred height of the walls 103 is determined by the width of the sub-pixels and the angle $\theta_1$ employed for directional deposition of the organic EL medium. The present invention is generally applicable to the formation of individual pixels in the numbers and sizes within conventional ranges. Smaller edge length pixels require greater care in construction. Pixels having overall edge lengths of up to about 400 $\mu$m are contemplated for fine detail imaging. For fine detail imaging preferred sub-pixel widths are in the range of from about 200 to 20 $\mu$m, most preferably from 100 to 25 $\mu$m. Directional deposition of the organic EL medium to define sub-pixel areas is generally feasible for $\theta_1$ angles of from 10° to 70°, most preferably from about 30° to 60°. When $\theta_1$ is 45°, the height of the walls 103 equals the widths of the sub-pixels. When $\theta_1$ is 60°, the height of the walls 103 need only slightly exceed 100 $\mu$m in height to produce sub-pixel widths of 200 $\mu$m. It is generally preferred that the walls 103 be limited to 150 $\mu$m or less in height.

The walls 103 and 105 can be formed in any width convenient for their formation. Ratios of wall height to width in the range of from 5:1 to 1:1 are readily achieved and generally preferred. It is contemplated that the active (i.e., the light emitting) portion of each pixel will account for at least 25% and optimally at least 50% of the total pixel area. For pixels larger than about 400 $\mu$m on an edge the width of the walls rarely accounts for a significant fraction of the total pixel area.

Although the multicolor image display device 100 fully satisfies the requirements of the invention, the device exhibits some disadvantages. First, referring to FIG. 1, it is apparent that in successively biasing each first electrode it must carry current to each of the pixels in the same row that is to emit light. Hence, the current carried by each first electrode is the sum of the currents carried by each of the second electrode elements in stimulating a row of pixels to emit light. The disadvantage of this arrangement is that the first electrodes must be light transmissive for light emissions to be seen and their thicknesses must be limited to retain this property. However, limiting first electrode thickness also limits conductance.

If the pixels are addressed successively in columns rather than rows, each of the second electrode elements a and b must carry the current of all pixels in the same column. Although the thickness of the second electrode elements can and usually does exceed that of the first electrodes, the width of the second electrode elements must be less than the width of a sub-pixel. As a consequence, the conductance of the second electrode elements is also restricted. Further, addressing the pixels column by column is unattractive, since in an array having an equal number of pixels in columns and rows the addressing rate for columns must be twice that employed for rows, since each column contains two second electrode elements. Since the time in which the sub-pixels in a column can be biased to emit light is halved, the biasing voltage must be increased as compared to row addressing to maintain a sub-pixel coulomb level and emission level during biasing equal to that obtained with row by row addressing. Increased biasing voltages and doubled addressing rates for comparable emission properties represent a significant disadvantage.

Another disadvantage of the device 100 is that the walls 103 and 105 being of unequal heights must be formed in separate steps.

Figure 5:
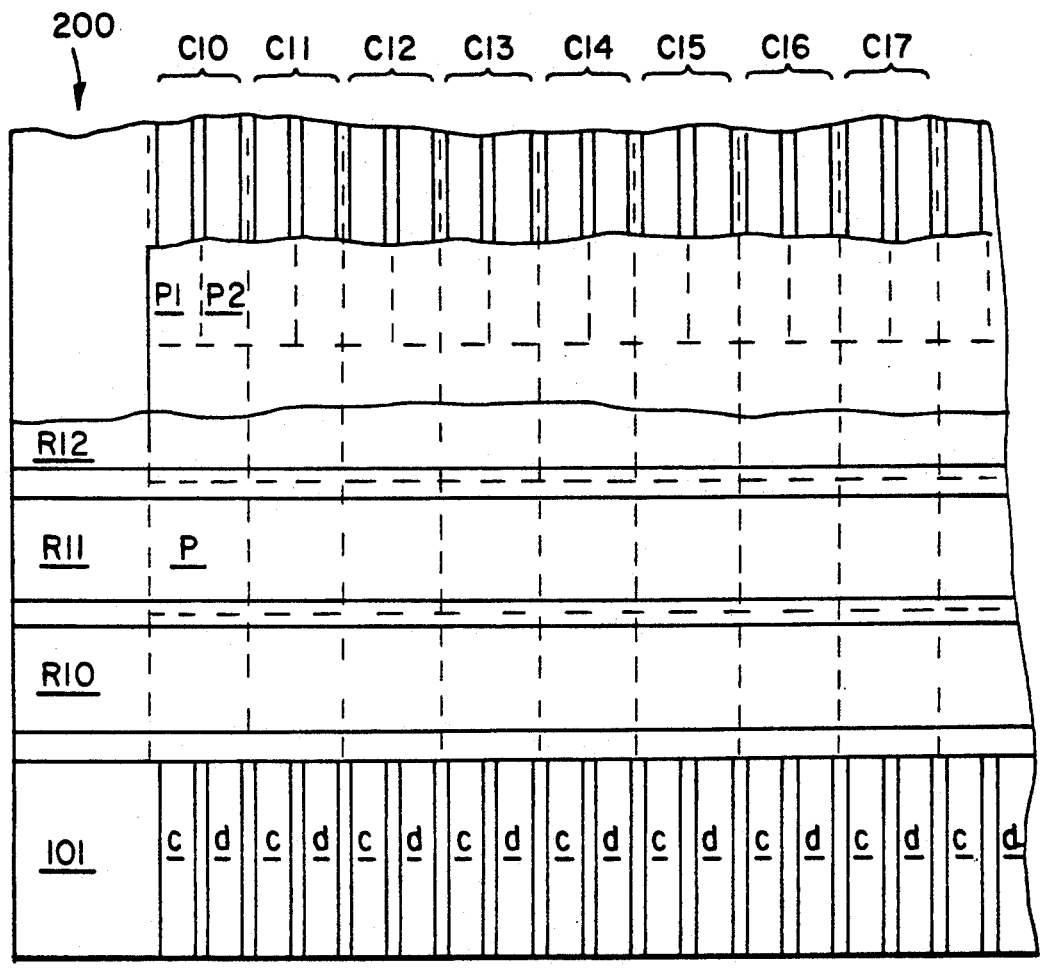
FIG. 5 is a plan view with portions broken away of a second embodiment of the invention.

The multicolor organic EL image display device 200 shown in FIG. 5 exhibits all of the imaging capabilities of the device 100 while at the same time overcoming its disadvantages noted above. Except as specifically noted, the features of the device 200 can take any of the forms described in connection with the device 100 and therefore require no further explanation.

The first electrodes C10, C11, C12, C13, C14, C15, C16 and C17 of device 200 are each divided into elements c and d. The first electrode elements c and d have the light transmissive properties of the first electrodes of device 100 and, like the first electrodes of device 100, are located on the support 101 prior to depositing the organic EL medium. Each first electrode element c forms a part of and joins sub-pixels P1 in the same column while each first electrode element d forms a part of and joins sub-pixels P2 in the same column. The second electrodes R10, R11 and R12 can be constructed of the same materials and in the same thickness ranges as the second electrode elements of device 100, but are arranged in rows rather than columns. The row arrangement allows the second electrodes to be wider than the second electrodes of device 100.

The electrode arrangement of the device 200 achieves higher electrode conductances than can be realized in device 100. In addressing a row of pixels each of the first electrode elements c and d is biased independently to achieve the desired pattern of emission from the pixels in one row. Simultaneously one of second electrodes is biased to stimulate emission within a selected row. Each of the first electrode elements stimulates only one sub-pixel and carries only the current of one sub-pixel. The second electrode in the selected row carries the current of all the sub-pixels stimulated to emit in that row. Since the second electrodes need not be light transmissive and, hence, can be much thicker as well as wider than the first electrode elements, the conductance of the electrodes of device 200 can be higher than that of the electrodes of device 100. In device 200 these conductance advantages are realized without resorting to a column by column scanning approach described in connection with device 100 that requires a doubled scanning rate.

Figure 6:
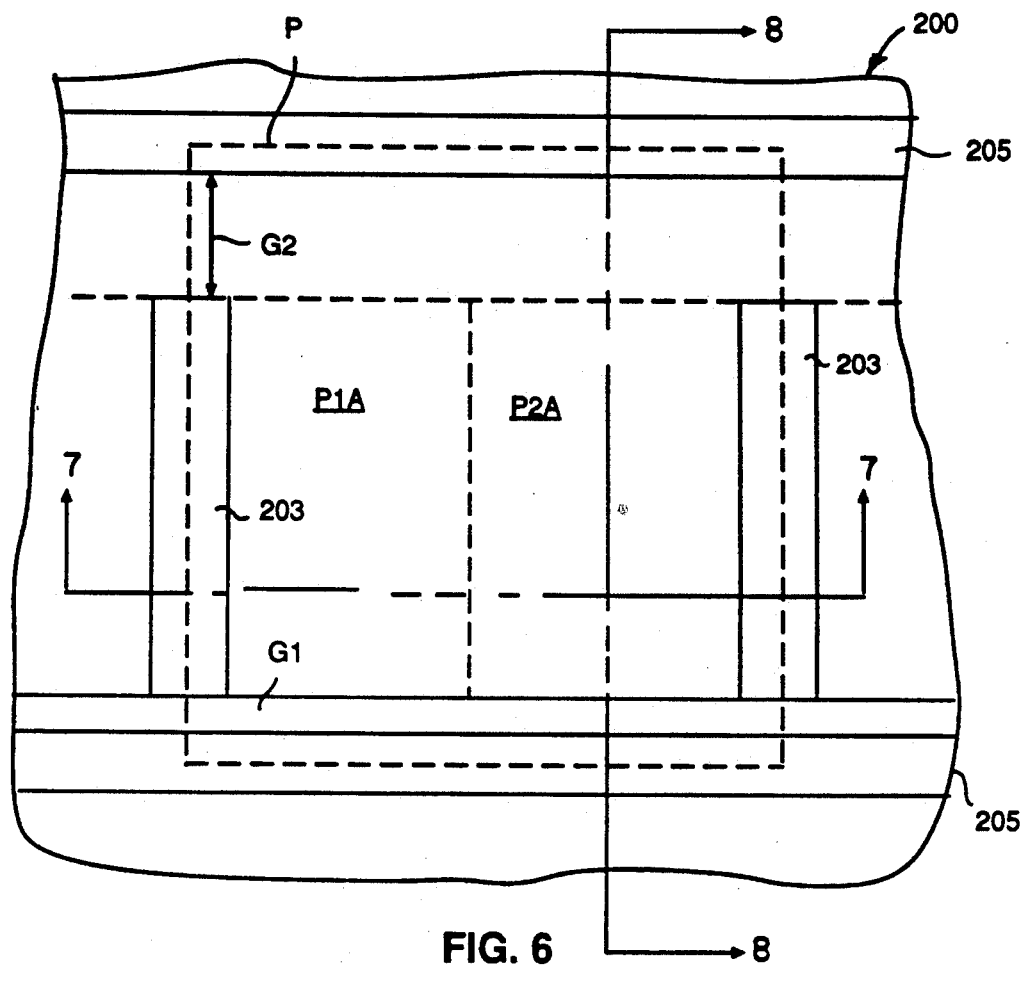
FIG. 6 is a plan view of a pixel of the second embodiment of the invention.
Figure 7:
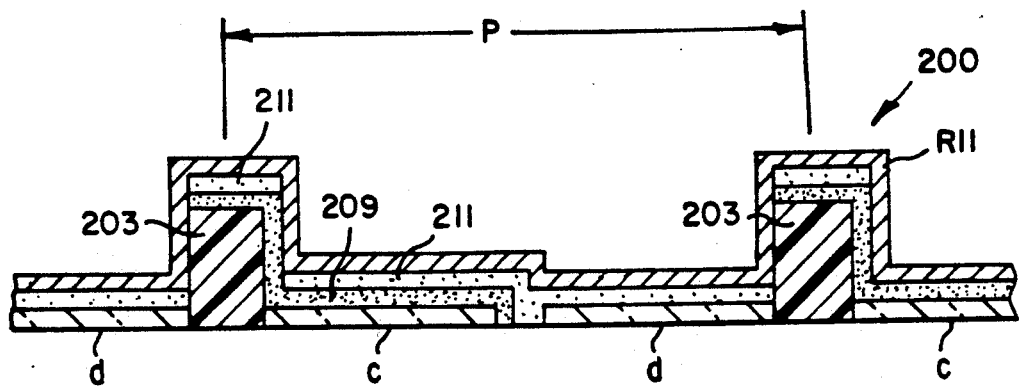
FIGS. 7 and 8 are sectional views taken along section lines 7—7 and 8—8, respectively, in FIG. 6.
Figure 8:
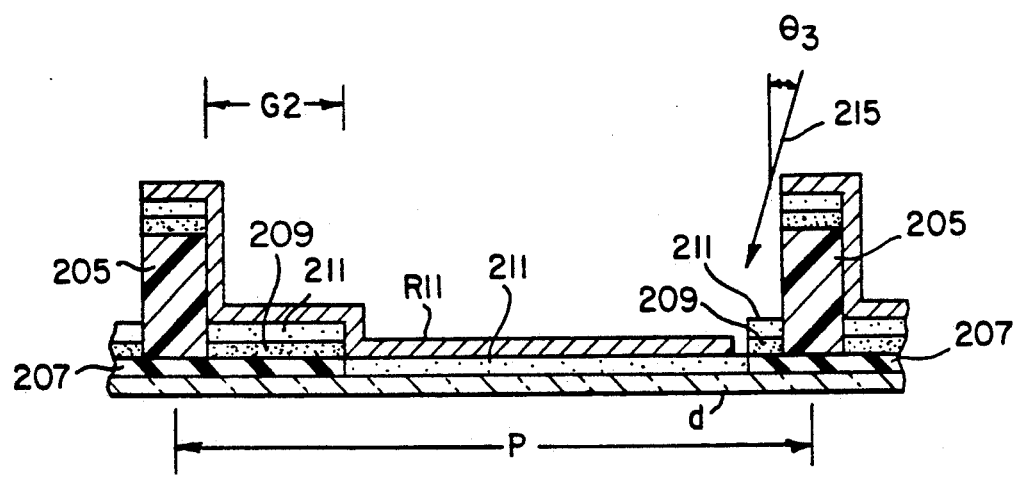

The construction of one of the pixels P of the device 200 is shown in FIGS. 6, 7 and 8. Walls 205 are located along the boundaries of pixels in adjacent rows, each wall being shared by an entire row. Walls 203 are located at the column boundaries of each pixel and between the first electrode elements c and d of adjacent pixels. The walls 203 are spaced from one adjacent wall 205 by a short distance or gap G1 and are spaced from the remaining adjacent wall 205 by a significantly larger distance or gap G2.

The walls 203 perform the same function as the walls 103 during deposition of the organic EL medium. During deposition of a first portion 209 of the organic EL medium using the same procedure described above in connection with first portion 109, deposition occurs in all areas of the pixel, except the area P2A, which is the active area of sub-pixel P2. The second portion 211 of the organic EL medium is deposited similarly as second portion 111. For simplicity the portions of the organic EL medium that are deposited on the walls and hence perform no useful function are not shown in this or subsequently described embodiments.

Note that the active area P2A of the sub-pixel P2 is slightly less than in device 100, since the spacing between the walls at row and column boundaries leaves areas that are the width of gaps G1 and G2 from which the first portion 209 of the organic EL medium cannot be excluded within the sub-pixel P2 area. To prevent unwanted electroluminescence of the hue of the first portion of the organic EL medium in the area of the gap G2 an insulative pad 207 is formed in the gap areas after the first electrode elements are formed on the support and before forming the walls. The insulative pads can be formed by any convenient thin insulative layer. The insulative pad is preferably less than 1 μm and most preferably less than 5000 Å in thickness. Although any convenient insulative material can be employed to form the insulative pad, silica is an ideal insulator, for this purpose. Patterning of the insulative pad can be undertaken by any convenient technique, preferably by conventional photolithography. Each insulative pad, as shown, is positioned at the boundaries of the adjacent rows of pixels and extends over the contiguous areas of gap G1, one of the walls 205 and gap G2. In fact, it is necessary for the insulative pad to occupy only the area of gap G2 to prevent unwanted electroluminesce and this only in the areas of sub-pixels P2. It is, however, simpler to construct the insulative pad as a continuous stripe that crosses both the sub-pixels P1 and P2. In crossing sub-pixels P1 the active area of each of these sub-pixels is reduced to area P2A. Thus the active areas of the sub-pixels are equal and balanced.

It is preferred to incorporate the insulative pads in the device 200 when constructed as shown. The insulative pads are not, however, required. Even with the insulative pads absent in the areas of gap G2 the vertical spacing between the first electrode elements and the overlying second electrode is increased as compared to active sub-pixel areas by the presence of both organic EL medium portions 209 and 211. This reduces the potential gradient between the electrodes in these areas and results in diminished electroluminescence. Hence emission hue from sub-pixels P2, though to some extent shifted by unwanted emission from the gap G2, is still acceptable for less demanding imaging applications.

In FIG. 7 the second electrode R11 is shown joining adjacent pixels in the same row. Note that there is no wall corresponding to wall 105 shown in FIG. 7. The function of walls 105 in device 100 is performed by walls 205, and is apparent from FIG. 8. The metal forming the second electrode R11 is directionally deposited as indicated by arrow 215 at an angle $\theta_3$. Since the height of walls 205 equal to that of walls 103, the walls are greater in height than the walls 105 and the angle $\theta_3$ equal to or even smaller than the angle $\theta_2$. It is generally preferred that $\theta_3$ be at least 5°.

The gap G1 between the walls at column and row boundaries results in each second electrode being laterally spaced from adjacent second electrodes throughout the length of each row. The gap G2 provides a intersection boundary between pixels in the same row that is free of the walls and can therefore be traversed by the second electrodes with increased assurance of electrical continuity. The metal overlying the walls is more prone to local electrical discontinuities due to the short radius of curvature of the wall edges. If, however, electrical continuity of the metal overlying the walls is found to be satisfactory for a particularly selection of second electrode constructions, the gap G2 can be entirely eliminated which in turn allows the elimination of the insulative pads 207. This increases the active areas of the sub-pixels. It also allows the walls 203 to intersect the wall 205 in each pixel area that would otherwise be separated by gap G2. This has the effect of laterally bracing the walls and reducing the risk of inadvertent wall damage during fabrication.

A significant advantage of the device 200 construction is that all of the walls can be of the same height and therefore can be fabricated concurrently. This simplifies fabrication.

The multicolor organic EL image display devices 100 and 200 can contain a variety of image color combinations. In each pixel the following combinations are possible:

(a) only the first sub-pixel emits light of a first hue;
(b) only the second sub-pixel emits light of a different hue;
(c) both the first and second sub-pixels emit light which the eye blends to create a perception of seeing a third hue;
(d) neither of the sub-pixels emit, creating a black background for emissions in other pixels. Thus, with sub-pixels capable of emitting only two hues a diversity of image hues are possible.

Nevertheless, the multicolor devices 100 and 200 lack the ability to display images in the full range of hue combinations perceptible to the human eye. To have the capability of full color image display it is necessary for each the pixels to be divided into at least three sub-pixels each having the capability of emitting a different one of the three additive primary colors. Blue, green and red triads of primary emission colors are most commonly employed for full color image display.

Figure 9:
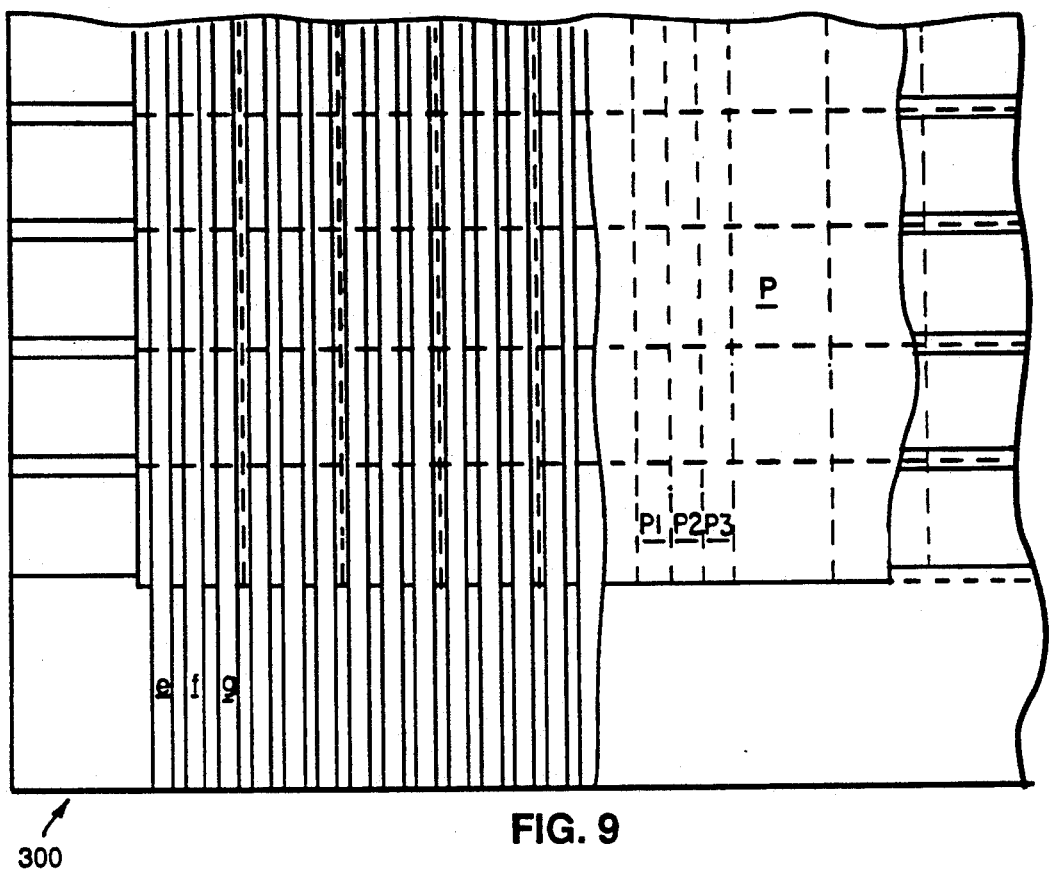
FIG. 9 is a plan view with portions broken away of a third embodiment of the invention.
Figure 10:
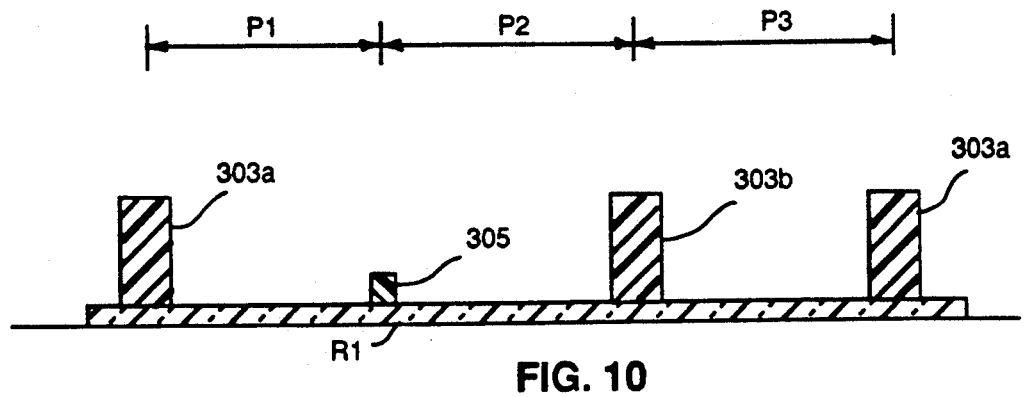
FIGS. 10 to 14 inclusive are sectional schematic diagrams of one pixel of the third embodiment of the invention at successive stages of fabrication.
Figure 15:
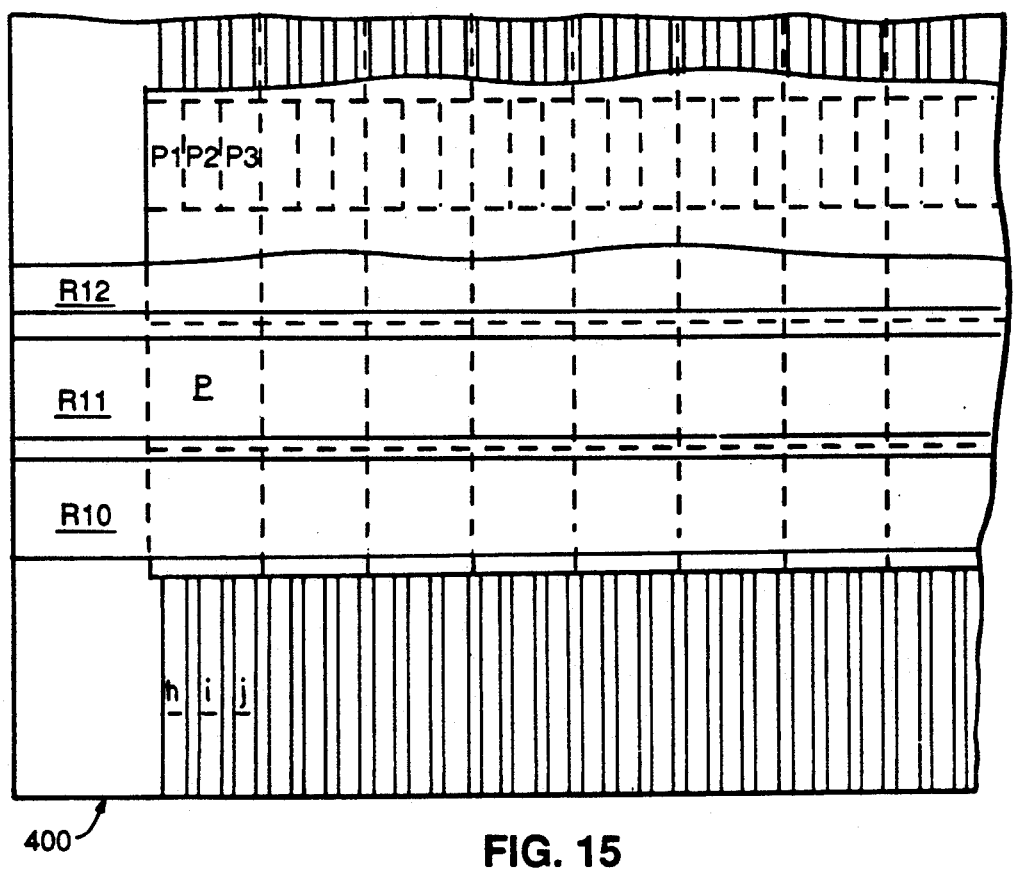
FIG. 15 is a plan view with portions broken away of a fourth embodiment of the invention.

Multicolor organic EL image display devices 300 and 400 illustrate device constructions according to the invention that have full color image display capabilities. Devices 300 and 400, as shown in FIGS. 9 and 15, are essentially similar to devices 100 and 200, respectively, as shown in FIGS. 1 and 5, except that each pixel P is sub-divided into three sub-pixels P1, P2 and P3, each of which is capable of emitting at a peak wavelength in a different one of the blue, green and red portions of the spectrum. Because each pixel is sub-divided into three sub-pixels instead of two, the two second electrode elements a and b in device 100 are replaced by three second electrode elements e, f and g in device 300. Similarly, the first electrode elements c and d in device 200 are replaced by three first electrode elements h, i and j in device 400.

The construction of the device 300 is, except as specifically noted, similar to that employed for constructing the device 100. Fabrication of device 100 is illustrated by FIGS. 10 to 14 inclusive. Walls 303a and 303b can be identical to walls 103. Like walls 103 the walls 303a are located at the boundaries of adjacent pixels. The walls 303b are located at the P2 and P3 sub-pixel boundaries. The walls 305 are similar to walls 105 and are located at the shared boundaries of sub-pixels P1 and P2.

Figure 11:
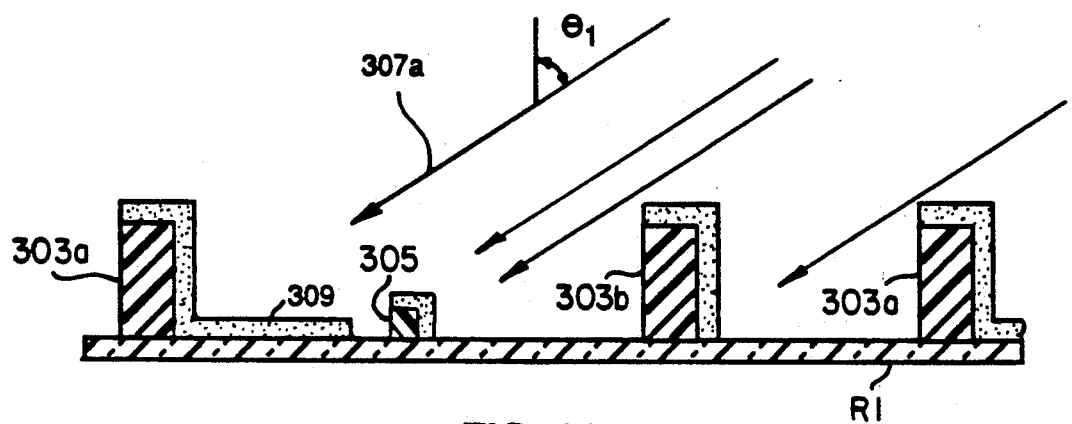

When a first portion 309 of the organic EL medium is deposited in the first sub-pixel areas P1 overlying the first electrode R1, it is deposited at an angle $\theta_1$ in direction indicated by arrows 307a. Note that the walls 303a and 303b prevent deposition over the first electrodes in the second and third sub-pixel areas, but the shorter wall 305 allows the desired deposition of the first portion of the organic EL medium in the first sub-pixel areas. The deposition pattern is shown in FIG. 11.

Figure 12:
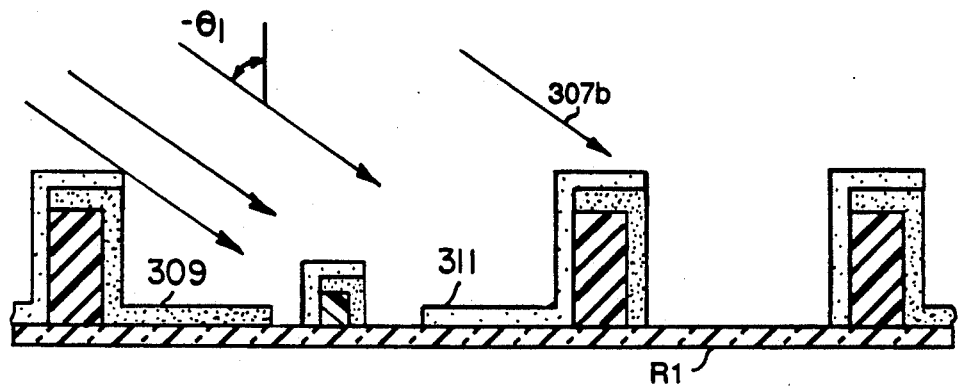

Referring to FIG. 12, a second portion 311 of the organic EL medium responsible for a second primary color of emission is selectively deposited in the second sub-pixels P2 simply by reversing the angle of directional deposition to $-\theta_1$ as indicated by arrows 307b.

Figure 13:
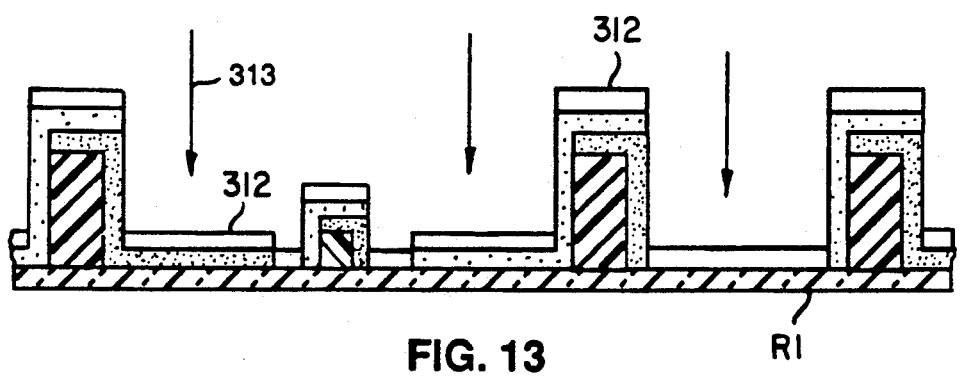

Referring to FIG. 13, a third portion 312 of the organic EL medium responsible for a third primary color of emission is uniformly deposited as indicated by arrows 313. In the first and second sub-pixels the third portion of the organic EL medium overlies the previously deposited portions and is ineffective to alter the hue of emission in these areas. In the third sub-pixels P3 the third portion 312 is the nearest luminescent material to the first electrode R1 and controls the hue of emission.

Figure 14:
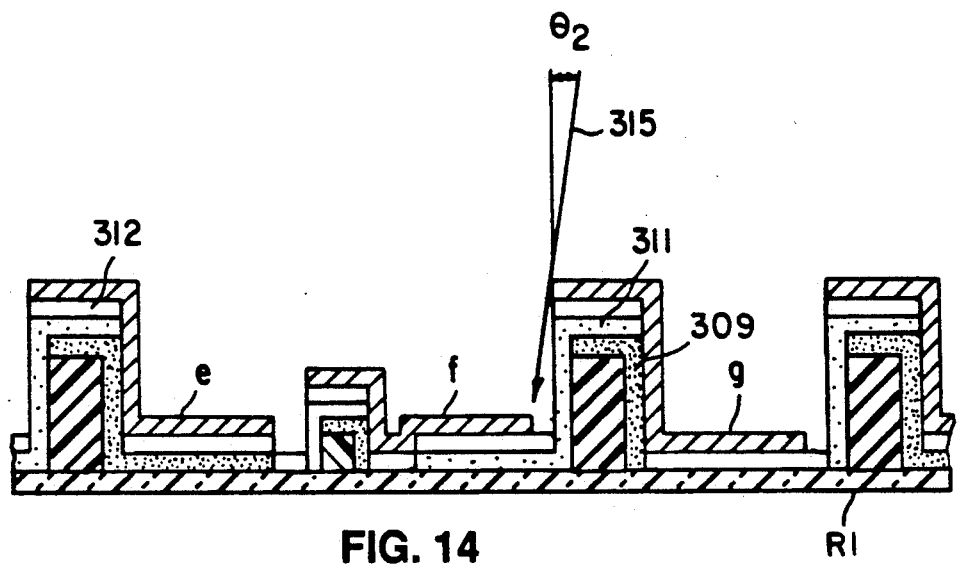

Referring to FIG. 14, formation of the second electrode elements e, f and g connecting the first, second and third sub-pixels in each column is undertaken by the same procedure described in connection with FIG. 4. The arrow 315 indicates the direction of deposition.

The device 300 exhibits all of the advantages of the device 100 and in addition has the capability of full color imaging. Employing blue, green and red primary color emissions, the following emission combinations are possible from each pixel:

(a) stimulate one sub-pixel to emit blue;
(b) stimulate one sub-pixel to emit green;
(c) stimulate one sub-pixel to emit red;
(d) stimulate two sub-pixels to emit blue and green, creating the perception of cyan;
(e) stimulate two sub-pixels to emit blue and red, creating the perception of magenta;
(f) stimulate two sub-pixels to emit green and red, creating the perception of yellow;
(g) stimulate all sub-pixels to create white light emission; and
(h) stimulate none of the sub-pixels to provide a dark, essentially black background.

Figure 16:
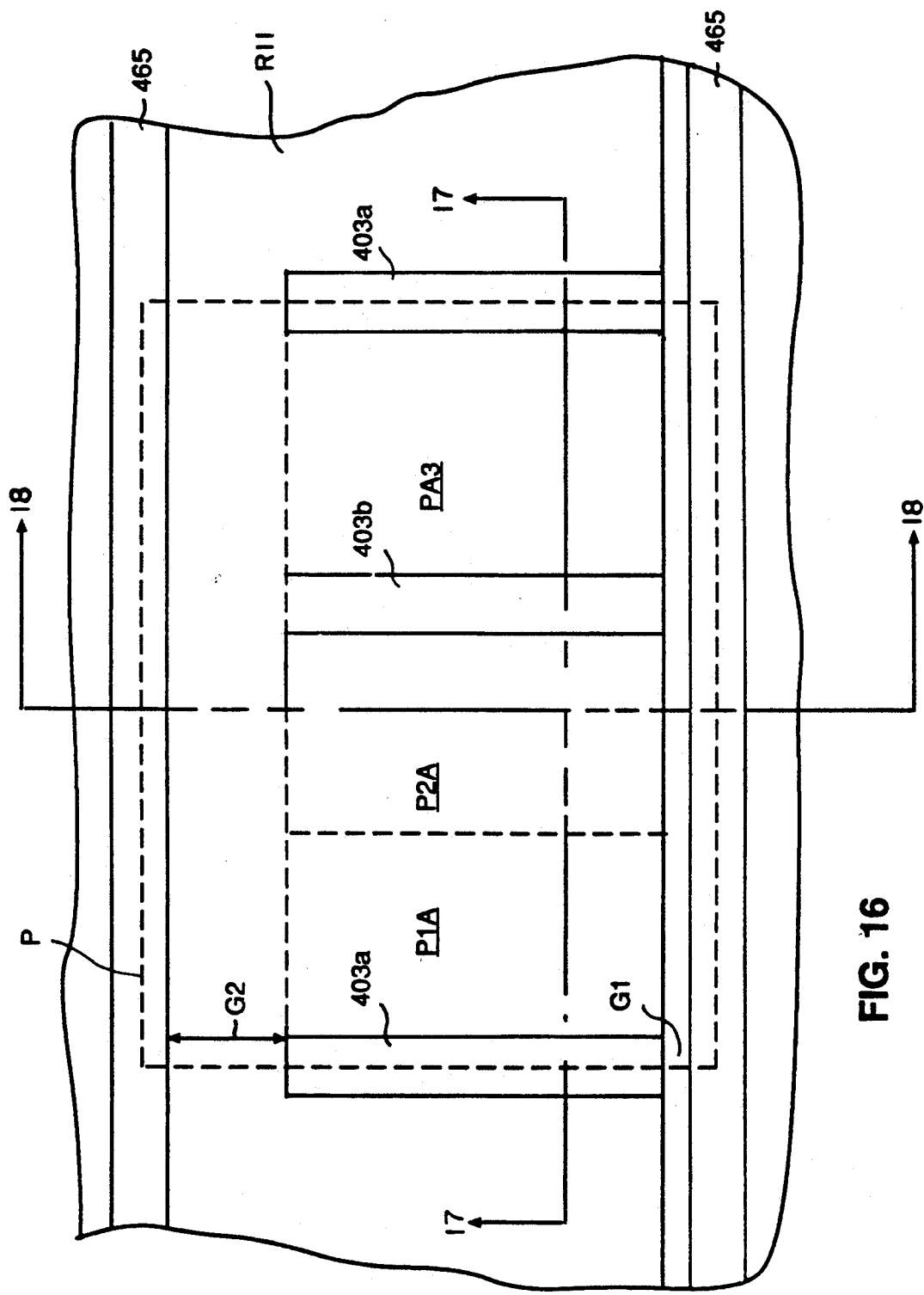
FIG. 16 is a plan view of a pixel of the fourth embodiment of the invention.
Figure 17:
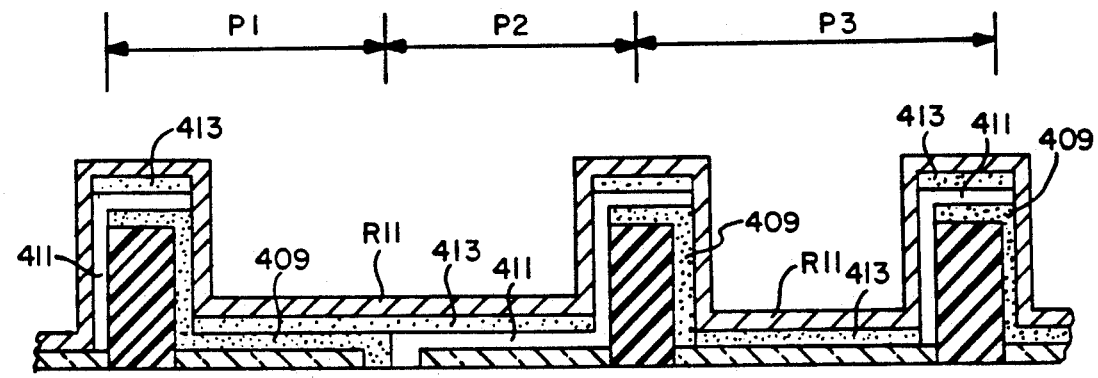
FIGS. 17 and 18 are sectional views taken along section lines 17—17 and 18—18, respectively, in FIG. 16.
Figure 18:
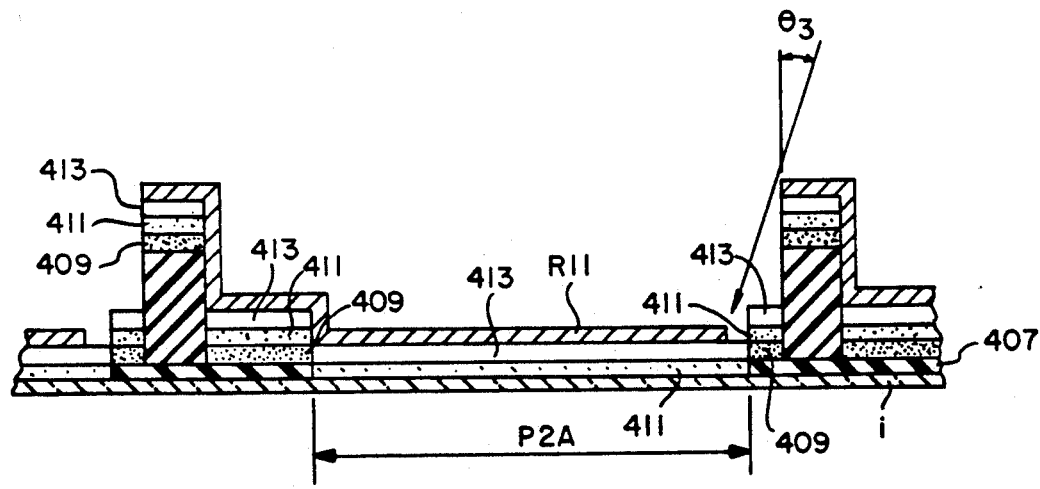

A pixel P of the full color organic EL medium image display device 400 is shown in FIGS. 16 to 18 inclusive. Walls 405 are located along the row boundaries of the pixels, each wall being shared by adjacent rows of pixels. Walls 403a are located at the column boundaries of each pixel and between the first electrode elements h and j of adjacent pixels. An additional wall 403b is located within the pixel at the boundaries of the sub-pixels P2 and P3. The walls 403a and 403b are spaced from one adjacent wall 405 by a short distance or gap G1 and are spaced from the remaining adjacent wall 405 by a significantly larger distance or gap G2.

During deposition of a first portion 409 of the organic EL medium by the procedure used to form the first portions 109 and 209, deposition occurs in all areas of the pixel, except the areas P2A and P3A, which are the active areas of pixels P2 and P3, respectively. In areas of the gaps G1 and G2 the first portion overlies the insulative pads 407, thereby limiting the first sub-pixel to active area P1A. The second and third portions 411 and 413 of the organic EL medium are deposited in the active sub-pixel areas P2A and P3A, respectively, similarly as the second and third portions 311 and 312, previously described. The deposition of the second electrode R11 is the same as described in connection with device 200, as indicated by directional deposition arrow 415 and deposition angle $\theta_3$.

The device 400 has all of the advantages of the device 200 and in addition has the capability of producing full color images of device 300.

The materials of the image display organic EL devices of this invention can take any of the forms of conventional organic EL devices, such as those of Scozzafava, cited above; Tang U.S. Pat. No. 4,356,429; VanSlyke et al U.S. Pat. No. 4,539,507; VanSlyke et al U.S. Pat. No. 4,720,432; Tang et al U.S. Pat. No. 4,885,211; Tang et al U.S. Pat. No. 4,769,292; Perry et al U.S. Pat. No. 4,950,950; Littman et al U.S. Pat. No. 5,059,861; VanSlyke U.S. Pat. No. 5,047,687; Scozzafava et al U.S. Pat. No. 5,073,446; VanSlyke et al U.S. Pat. No. 5,059,862; VanSlyke et al U.S. Pat. No.

5,061,617; the disclosures of which are here incorporated by reference.

A specifically preferred support for the devices of the invention is a transparent glass support. The preferred first electrodes of the devices of this invention are transparent indium tin oxide electrodes coated directly on the glass support.

The organic EL medium coated over the first electrodes is preferably made up of a sequence of superimposed layers. Of these layers only one or two of the layers specifically responsible for electroluminescence need be deposited in an areally restricted manner as described above. It is, of course, recognized that the techniques and arrangements described above for patterning the electroluminescent portion of the organic EL medium can be used for the deposition of other layer portions of the organic EL medium, if desired.

It is specifically preferred to deposit as a uniform layer over all areas in which the organic EL medium contacts the first electrodes a hole injecting layer comprised of a porphyrinic compound of the type disclosed by Adler U.S. Pat. No. 3,935,031 or Tang U.S. Pat. No. 4,356,429, the disclosures of which are here incorporated by reference.

Preferred porphyrinic compounds are those of structural formula (I):

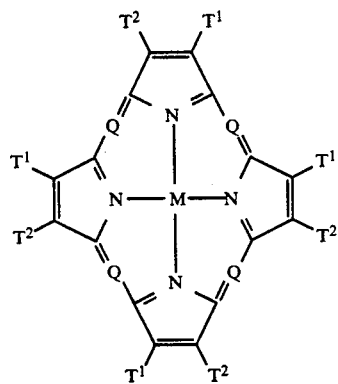

wherein

Q is —N= or —C(R)=;

M is a metal, metal oxide, or metal halide;

R is hydrogen, alkyl, aralkyl, aryl, or alkaryl, and $T^1$ and $T^2$ represent hydrogen or together complete a unsaturated 6 membered ring, which can include substituents, such as alkyl or halogen. Preferred alkyl moieties contain from about 1 to 6 carbon atoms while phenyl constitutes a preferred aryl moiety.

In an alternative preferred form the porphyrinic compounds differ from those of structural formula (I) by substitution of two hydrogens for the metal atom, as indicated by formula (II):

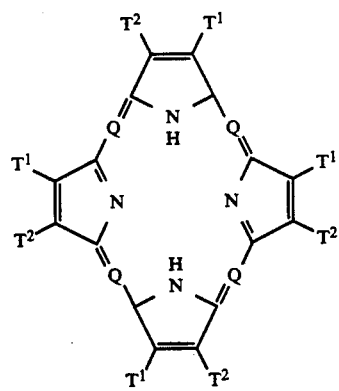

Highly preferred examples of useful porphyrinic compounds are metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:

PC-1 Porphine
PC-2 1,10,15,20-Tetraphenyl-21H,23H-porphine copper (II)
PC-3 1,10,15,20-Tetraphenyl-21H,23H-porphine zinc (II)
PC-4 5,10,15,20-Tetrakis(pentafluorophenyl)-21H,23H-porphine
PC-5 Silicon phthalocyanine oxide
PC-6 Aluminum phthalocyanine chloride
PC-7 Phthalocyanine (metal free)
PC-8 Dilithium phthalocyanine
PC-9 Copper tetramethylphthalocyanine
PC-10 Copper phthalocyanine
PC-11 Chromium phthalocyanine fluoride
PC-12 Zinc phthalocyanine
PC-13 Lead phthalocyanine
PC-14 Titanium phthalocyanine oxide
PC-15 Magnesium phthalocyanine
PC-16 Copper octamethylphthalocyanine In preferred constructions of devices according to the invention a hole transporting layer is uniformly deposited over the hole injecting layer. The hole transporting layer preferably contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinylene radicals and/or containing at least one active hydrogen containing group are disclosed by Brantley et al U.S. Pat. Nos. 3,567,450 and 3,658,520.

A preferred class of aromatic tertiary amines are those which include at least two aromatic tertiary amine moieties. Such compounds include those represented by structural formula (III):

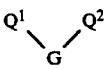

wherein

Q¹ and Q² are independently aromatic tertiary amine moieties and

G is a linking group such an arylene, cycloalkylene, or alkylene group or a carbon to carbon bond.

A particularly preferred class of triarylamines satisfying structural formula (III) and containing two triarylamine moieties are those satisfying structural formula (IV):

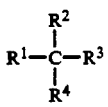

where

R¹ and R² each independently represents a hydrogen atom, an aryl group or alkyl group or R¹ and R² together represent the atoms completing a cycloalkyl group and R³ and R⁴ each independently represents an aryl group which is in turn substituted with a diaryl substituted amino group, as indicated by structural formula (V):

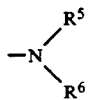

wherein R⁵ and R⁶ are independently selected aryl groups.

Another preferred class of aromatic tertiary amines are tetraaryldiamines. Preferred tetraaryldiamines include two diarylamino groups, such as indicated by formula (IV), linked through an arylene group. Preferred tetraaryldiamines include those represented by formula (VI).

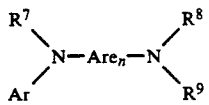

wherein

Are is an arylene group, n is an integer of from 1 to 4, and

Ar, R⁷, R⁸, and R⁹ are independently selected aryl groups.

The various alkyl, alkylene, aryl, and arylene moieties of the foregoing structural formulae (III), (IV), (V), and (VI) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 5 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are preferably phenyl and phenylene moieties.

Representative useful aromatic tertiary amines are disclosed by Berwick et al U.S. Pat. No. 4,175,960 and Van Slyke et al U.S. Pat. No. 4,539,507. Berwick et al in addition discloses as useful hole transporting compounds N substituted carbazoles, which can be viewed as ring bridged variants of the diaryl and triarylamines disclosed above.

Following the teachings of VanSlyke et al U.S. Pat. No. 5,061,569, it is possible to achieve higher organic device stabilities both during short term and extended operation by substituting for one or more of the aryl groups attached directly to a tertiary nitrogen atom in the aromatic tertiary amines described above an aromatic moiety containing at least two fused aromatic rings. The best combination of both short term (0-50 hours) and long term (0-300+ hours) of operation are achieved when the aromatic tertiary amines are those which (1) are comprised of at least two tertiary amine moieties and (2) include attached to a tertiary amine nitrogen atom an aromatic moiety containing at least two fused aromatic rings. The fused aromatic ring moieties of the tertiary amines can contain 24 or more carbon atoms and preferably contain from about 10 to 16 ring carbon atoms. While unsaturated 5 and 7 membered rings can be fused to six membered aromatic rings (i.e., benzene rings) to form useful fused aromatic ring moieties, it is generally preferred that the fused aromatic ring moiety include at least two fused benzene rings. The simplest form of a fused aromatic ring moiety containing two fused benzene rings is naphthalene. Therefore, the preferred aromatic ring moieties are naphthalene moieties, where the latter is understood to embrace all compounds containing a naphthalene ring structure. In monovalent form the naphthalene moieties are naphthyl moieties, and in their divalent form the naphthalene moieties are naphthylene moieties.

Illustrative of useful aromatic tertiary amines are the following:

ATA-1 1,1-Bis(4-di-p-tolylaminophenyl)cyclohexane

ATA-2 1,1-Bis(4-di-p-tolylaminophenyl)-4-phenylcyclohexane

ATA-3 4,4'''-Bis(diphenylamino)quaterphenyl

ATA-4 Bis(4-dimethylamino-2-methylphenyl)-phenylmethane

ATA-5 N,N,N-Tri(p-tolyl)amine

ATA-6 4-(di-p-tolylamino)-4'-[4(di-p-tolylamino)-styryl]stilbene

ATA-7 N,N',N'-Tetra-p-tolyl-4,4'-diaminobiphenyl

ATA-8 N,N,N',N'-Tetraphenyl-4,4'-diaminobiphenyl

ATA-9 N-Phenylcarbazole

ATA-10 Poly(N-vinylcarbazole)

ATA-11 4,4'-Bis[N-(1-naphthyl)-N-phenylamino]biphenyl

ATA-12 4,4''-Bis[N-(1-naphthyl)-N-phenylamino]-p-terphenyl

ATA-13 4,4'-Bis[N-(2-naphthyl)-N-phenylamino]biphenyl

ATA-14 4,4'-Bis[N-(3-acenaphthenyl)-N-phenylamino]biphenyl

ATA-15 1,5-Bis[N-(1-naphthyl)-N-phenylamino]naphthalene

ATA-16 4,4'-Bis[N-(9-anthryl)-N-phenylamino]biphenyl

ATA-17 4,4''-Bis[N-(1-anthryl)-N-phenylamino]-p-terphenyl

ATA-18 4,4'-Bis[N-(2-phenanthryl)-N-phenylamino]biphenyl

ATA-19 4,4'-Bis[N-(8-fluoranthenyl)-N-phenylamino]-biphenyl
ATA-20 4,4'-Bis[N-(2-pyrenyl)-N-phenylamino]biphenyl
ATA-21 4,4'-Bis[N-(2-naphthacenyl)-N-phenylamino]-biphenyl
ATA-22 4,4'-Bis[N-(2-perylenyl)-N-phenylamino]-biphenyl
ATA-23 4,4'-Bis[N-(1-coronenyl)-N-phenylamino]-biphenyl
ATA-24 2,6-Bis(di-p-tolylamino)naphthalene
ATA-25 2,6-Bis[di-(1-naphthyl)amino]naphthalene
ATA-26 2,6-Bis[N-(1-naphthyl)-N-(2-naphthyl)amino]-naphthalene
ATA-27 4,4''-Bis[N,N-di(2-naphthyl)amino]terphenyl
ATA-28 4,4'-Bis{N-phenyl-N-[4-(1-naphthyl)phenyl-]amino}biphenyl
ATA-29 4,4'-Bis[N-phenyl-N-(2-pyrenyl)amino]biphenyl
ATA-30 2,6-Bis[N,N-di(2-naphthyl)amine]fluorene
ATA-31 4,4''-Bis(N,N-di-p-tolylamino)terphenyl
ATA-32 Bis(N-1-naphthyl)(N-2-naphthyl)amine Overlying the hole transporting layer are the luminescent layers of the devices. In each pixel a different luminescent layer contacts the hole transporting layer in each sub-pixel. A different luminescent layer choice is required for each hue of emission desired.

At least one luminescent layer preferably employs a metal oxinoid charge accepting compound satisfying the formula:

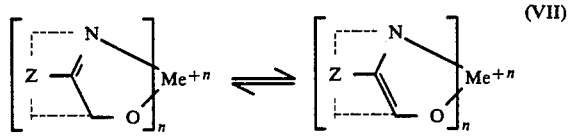

(VII)

where
Me represents a metal,
n is an integer of from 1 to 3, and
Z represents the atoms necessary to complete an oxine nucleus.

Illustrative of useful chelated oxinoid compounds are the following:
CO-1 Aluminum trisoxine
CO-2 Magnesium bisoxine
CO-3 Bis[benzo{f}-8-quinolinolato] zinc
CO-4 Aluminum tris(5-methyloxine)
CO-5 Indium trisoxine
CO-6 Lithium oxine
CO-7 Gallium tris(5-chlorooxine)
CO-8 Calcium bis(5-chlorooxine)
CO-9 Poly[zinc (II)-bis(8-hydroxy-5-quinolinyl)methane]
CO-10 Dilithium epindolidione
CO-11 Aluminum tris(4-methyloxine)
CO-12 Aluminum tris(6-trifluoromethyloxine)

Of the various metal oxinoids, the most highly preferred are the tris-chelates of aluminum. These chelates are formed by reacting three 8-hydroxyquinoline moieties with a single aluminum atom. These chelates include the specifically preferred green emitters aluminum trisoxine [a.k.a., tris(8-quinolinol) aluminum] and aluminum tris(5-methyloxine) [a.k.a. tris(5-methyl-8-quinolinol) aluminum].

For the construction of luminescent layers that emit in the blue portion of the spectrum it is preferred to employ mixed ligand aluminum chelates of the type disclosed by VanSlyke et al U.S. Pat. No. 5,150,006. In a specifically preferred form the mixed ligand aluminum chelates therein disclosed include bis($R^s$-8-quinolinolato)(phenolato)aluminum(III) chelate, where $R^s$ is a ring substituent of the 8-quinolinolato ring nucleus chosen to block the attachment of more than two 8-quinolinolato ligands to the aluminum atom. These compounds can be represented by the formula:

$$(R^s-Q)_2-Al-O-L \qquad (VIII)$$

where
Q in each occurrence represents a substituted 8-quinolinolato ligand,
$R^s$ represents an 8-quinolinolato ring substituent chosen to block sterically the attachment of more than two substituted 8-quinolinolato ligands to the aluminum atom,
O-L is phenolato ligand, and
L is a hydrocarbon of from 6 to 24 carbon atoms comprised of a phenyl moiety.

The advantage of employing an aluminum chelate with two substituted 8-quinolinolato ligands and a phenolato ligand is that all of the desirable physical properties of tris(8-quinolinolato)aluminum(III) chelates, the preferred green emitting luminophors of organic EL devices, are retained while emission is shifted to the blue region of the spectrum.

The presence of the phenolato ligand is responsible for shifting emissions to the blue portion of the spectrum. As employed herein the term "phenolato ligand" is employed in its art recognized usage to mean a ligand bonded to the aluminum atom by the deprotonated hydroxyl group of a phenol.

In its simplest form the phenolato ligand can be provided by deprononation of hydroxybenzene. Organic EL device performance has demonstrated that peak emission at a shorter wavelength than 500 nm and acceptable device stability (retention of at least a half of initial luminescent intensity for more than 50 hours) can be realized.

In an effort to improve performance, substituted phenols were next investigated. It was observed that methoxy and dimethoxy substituted phenolato ligands exhibited relatively weak luminescent intensities. Since methoxy substituents are electron donating, phenols were also investigated with strongly electron withdrawing substituents, such as halo, cyano and α-haloalkyl substituents. Aluminum chelates with these ligands, though luminophors, did not undergo successful vapor phase conversions.

It has been determined that the preferred phenolato ligands for the aluminum chelates of formula VIII are derived from HO-L phenols, where L is a hydrocarbon of from 6 to 24 carbon atoms comprised of a phenyl moiety. This includes not only hydroxybenzene, but a variety of hydrocarbon substituted hydroxybenzenes, hydroxynaphthalenes and other fused ring hydrocarbons. Since monomethyl substitution of the phenyl moiety shorten emission wavelengths, it is preferred that the phenolato ligand contain at least 7 carbon atoms. Generally there is little advantage to be gained by employing phenolato ligands with very large numbers of carbon atoms. However, investigations of phenolato ligands with 18 aromatic ring carbon atoms have revealed high levels of stability. Thus, the phenoloato ligands preferably contain from 7 to 18 total carbon atoms.

Aliphatic substituents of the phenyl moiety of phenolato ligand are contemplated to contain from 1 to 12 carbon atoms each. Alkyl phenyl moiety substituents of from 1 to 3 carbon atoms are specifically preferred, with the best overall characteristics having been observed to be produced with methyl substituents.

Aromatic hydrocarbon substituents of the phenyl moiety are preferably phenyl or naphthyl rings. Phenyl, diphenyl and triphenyl substitution of the phenyl moiety have all been observed to produce highly desirable organic EL device characteristics.

Phenolato ligands derived from α or β naphthols have been observed to produce aluminum chelates of exceptional levels of stability. A limited degree of emission shifting to shorter wavelengths is also realized, similar to that exhibited by hydroxybenzene derived phenolato ligands. By employing naphtholato ligand containing aluminum chelates in combination with blue emitting fluorescent dyes, described below, highly desirable device constructions are possible.

From comparisons of ortho, meta and para substituted homologues of the various phenolato ligands it has been determined that little, if any, difference in performance is attributable to the position on the phenyl moiety ring occupied by the hydrocarbon substituent.

In a preferred form the aluminum chelates satisfy the following formula:

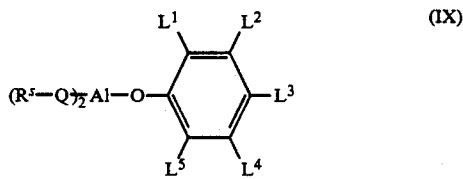

(IX)

where

Q and $R^s$ are as defined above and $L^1$, $L^2$, $L^3$, $L^4$ and $L^5$ collectively contain 12 or fewer carbon atoms and each independently represent hydrogen or hydrocarbon groups of from 1 to 12 carbon atoms, with the proviso that $L^1$ and $L^2$ together or $L^2$ and $L^3$ together can form a fused benzo ring.

Although either or both of the 8-quinolinolato rings can contain substituents other than the steric blocking substituent, further substitution of the rings is not required. It is appreciated further that more than one substituent per ring can contribute to steric blocking. The various steric blocking substituent possibilities are most easily visualized by reference to the following formula:

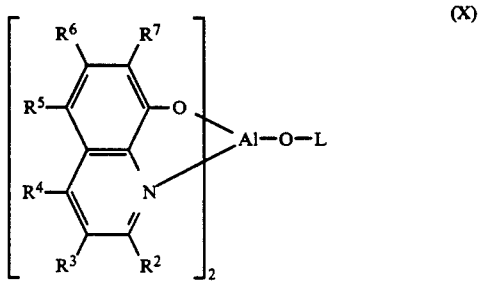

(X)

where L can take any form described above and $R^2$ to $R^7$ represent substitutional possibilities at each of ring positions 2 to 7 inclusive of the 8-quinolinolato rings. Substituents at the 4, 5 and 6 ring positions are not favorably located to hinder sterically the bonding of three 8-quinolinolato nuclei to a single aluminum atom. While it is contemplated that large substituents at the 3 or 7 ring positions could provide sufficient steric hindrance, the incorporation of bulky substituents substantially increases molecular weight without enhancing molecular performance and therefore detracts from overall performance. On the other hand, the 2 ring position is suited to provide steric hindrance, and even a very small substituent (e.g., a methyl group) in one of these ring positions provides an effective steric blocking substituent. For synthetic convenience it is specifically preferred that steric blocking substituents be located in the 2 ring positions. As employed herein the term "steric blocking" is employed to indicate that the $R^s$-Q ligand is incapable of competing for inclusion as the third ligand of the aluminum atom.

Although the phenolato ligand is primarily relied upon to obtain blue emission, it has been observed that substituents to the 8-quinolinolato rings can also perform useful hue shifting functions. The quinoline ring consists of fused benzo and pyrido rings. When the pyrido ring component of the quinoline ring is substituted with one or more electron donating substituents the effect is to shift the hue of emission away from the green region of the spectrum and toward a more primary blue emission. Electron donating substituents at the ortho and para positions of the pyrido ring (that is, the 2 and 4 positions of the quinoline ring) particularly influence the hue of emission, while the meta position on the pyrido ring (the 3 position on the quinoline ring) has a comparatively small influence on the hue of emission. It is, in fact, recognized that an electron accepting substituent could, if desired, be located at the 3 ring position while retaining a blue emission characteristic. Although steric hindrance is entirely independent of electron donating or accepting properties and, thus, $R^2$ can in theory take the form of either an electron donating or accepting group, it is preferred to choose $R^2$ from among electron donating groups. By adding a second electron donating group $R^4$ a further shift in hue away from the green portion of the spectrum is achieved. $R^3$, when present, can take any synthetically convenient form, but is preferably also electron donating.

It is well within the skill of the art to determine whether a particular substituent is electron donating or electron accepting. The electron donating or accepting properties of several hundred of the most common substituents, reflecting all common classes of substituents have been determined, quantified and published. The most common quantification of electron donating and accepting properties is in terms of Hammett σ values. Substituents with negative Hammett σ values are electron donating while those with positive Hammett σ values are electron accepting. Hydrogen has a Hammett σ value of zero, while other substituents have Hammett σ values that increase positively or negatively in direct relation to their electron accepting or donating characteristics. Lange's Handbook of Chemistry, 12th Ed., McGraw Hill, 1979, Table 3-12, pp. 3-134 to 3-138, here incorporated by reference, lists Hammett σ values for a large number of commonly encountered substituents. Hammett σ values are assigned based on phenyl ring substitution, but they provide a workable guide for qualitatively selecting electron donating and accepting substituents for the quinoline ring.

Taking all factors together, steric blocking, synthetic convenience, and electron donating or accepting properties, $R^2$ is preferably an amino, oxy or hydrocarbon substituent. Adequate steric hindrance is provided when $R^2$ is methyl and is the sole 8-quinolinolato ring substituent (i.e., each of $R^3$, $R^4$, $R^5$, $R^6$ and $R^7$ is hydrogen). Thus, any amino, oxy or hydrocarbon substituent having at least 1 carbon atom falls within the preview of preferred substituents. Preferably no more than 10 carbon atoms are present in any one hydrocarbon moiety and optimally no more than 6 carbon atoms. Thus, $R^2$ preferably takes the form of —R', —OR' or —N(R")R', where R' is a hydrocarbon of from 1 to 10 carbon atoms and R" is R' or hydrogen. Preferably $R^2$ contains 10 or fewer carbon atoms and optimally 6 or fewer carbon atoms.

$R^3$ and $R^4$ for the reasons set forth above can take a broader range of forms than $R^2$, but are specifically contemplated to be selected from among the same group of preferred substituents as $R^2$. Since 3 and 4 ring position substitution is not required, $R^3$ and $R^4$ can additionally be hydrogen.

Since 5, 6 or 7 ring position substitution is not required, $R^5$, $R^6$ and $R^7$ can represent hydrogen. In preferred forms $R^5$, $R^6$ and $R^7$ can be selected from synthetically convenient electron accepting substituents, such as cyano, halogen, and α-haloalkyl, α-haloalkoxy, amido, sulfonyl, carbonyl, carbonyloxy and oxycarbonyl substituents containing up to 10 carbon atoms, most preferably 6 or fewer carbon atoms.

The following constitute specific examples of preferred mixed ligand aluminum chelates satisfying the requirements of the invention:

PC-1 Bis(2-methyl-8-quinolinolato)(phenolato)-aluminum(III)

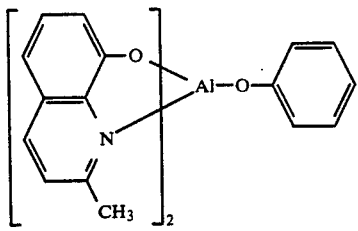

PC-2 Bis(2-methyl-8-quinolinolato)(ortho-cresolato)-aluminum(III)

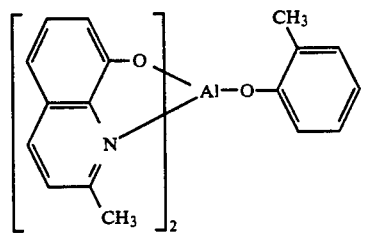

PC-3 Bis(2-methyl-8-quinolinolato)(meta-cresolato)-aluminum(III)

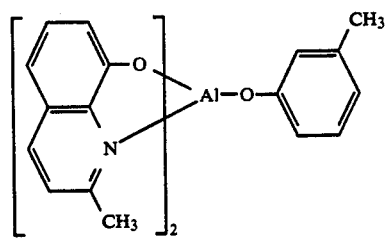

PC-4 Bis(2-methyl-8-quinolinolato)(para-cresolato)-aluminum(III)

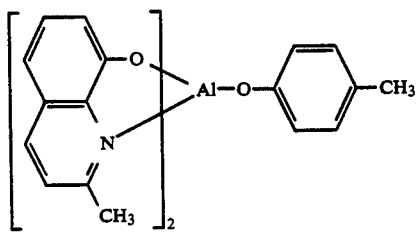

PC-5 Bis(2-methyl-8-quinolinolato)(ortho-phenylphenolato)aluminum(III)

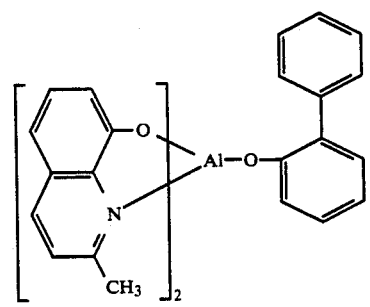

PC-6 Bis(2-methyl-8-quinolinolato)(meta-phenylphenolato)aluminum(III)

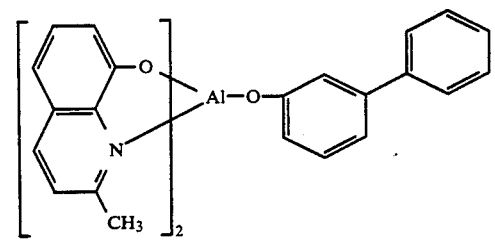

PC-7 Bis(2-methyl-8-quinolinolato)(para-phenylphenolato)aluminum(III)

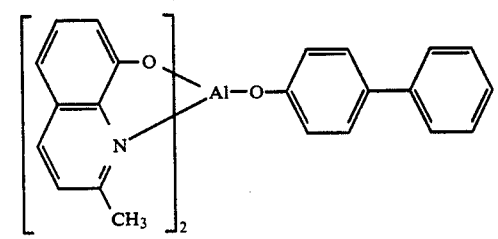

PC-8 B7is(2-methyl-8-quinolinolato)(2,3-dimethyl-phenolato)aluminum(III)

-continued

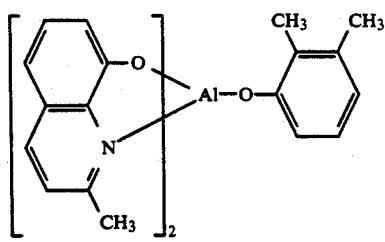

PC-9 Bis(2-methyl-8-quinolinolato)(2,6-dimethyl-phenolato)aluminum(III)

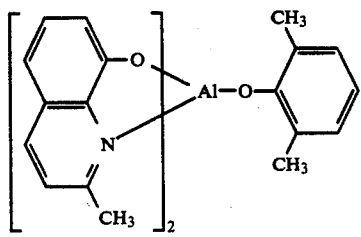

PC-10 Bis(2-methyl-8-quinolinolato)(3,4-dimethyl-phenolato)aluminum(III)

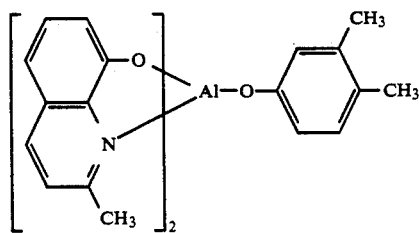

PC-11 Bis(2-methyl-8-quinolinolato)(3,5-dimethyl-phenolato)aluminum(III)

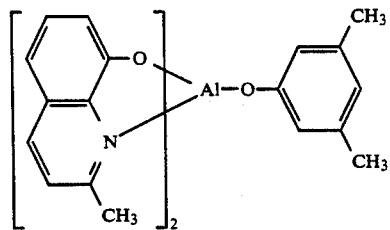

PC-12 Bis(2-methyl-8-quinolinolato)(3,5-di-tert-butylphenolato)aluminum(III)

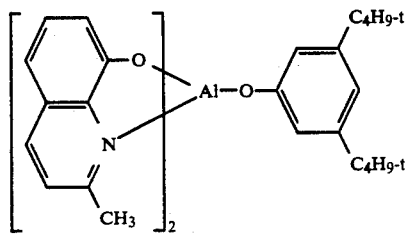

PC-13 Bis(2-methyl-8-quinolinolato)(2,6-diphenyl-phenolato)aluminum(III)

-continued

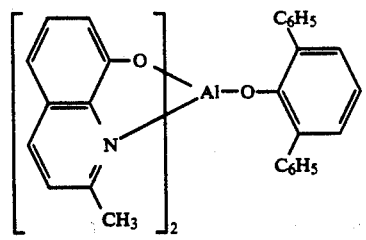

PC-14 Bis(2-methyl-8-quinolinolato)(2,4,6-tri-phenylphenolato)aluminum(III)

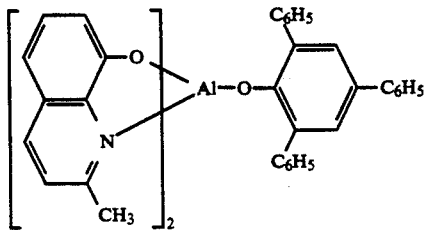

PC-15 Bis(2-methyl-8-quinolinolato)(2,3,6-tri-methylphenolato)aluminum(III)

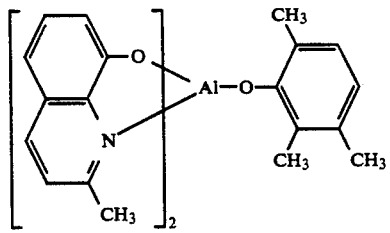

PC-16 Bis(2-methyl-8-quinolinolato)(2,3,5,6-tetra-methylphenolato)aluminum(III)

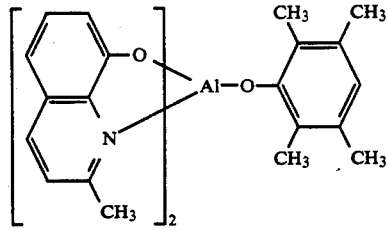

PC-17 Bis(2-methyl-8-quinolinolato)(1-naphtholato)-aluminum(III)

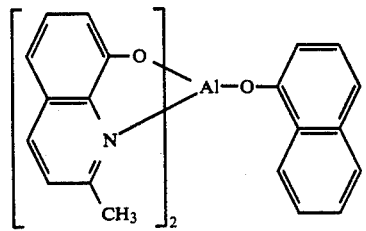

PC-18 Bis(2-methyl-8-quinolinolato)(2-naphtholato)-aluminum(III)

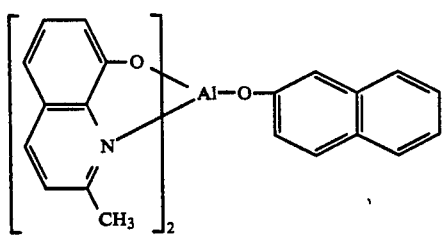

PC-19 Bis(2,4-dimethyl-8-quinolinolato)(ortho-phenyl-phenolato)aluminum(III)

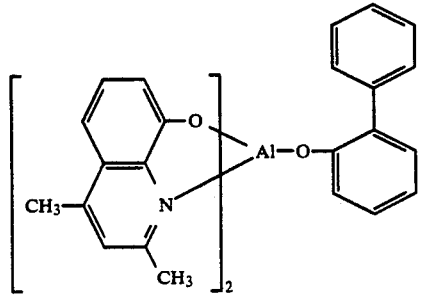

PC-20 Bis(2,4-dimethyl-8-quinolinolato)(para-phenylphenolato)aluminum(III)

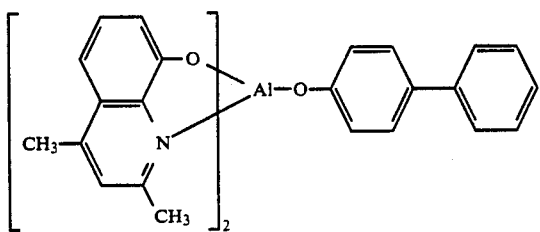

PC-21 Bis(2,4-dimethyl-8-quinolinolato)(meta-phenyl-phenolato)aluminum(III)

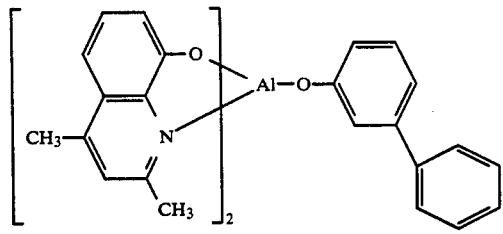

PC-22 Bis(2,4-dimethyl-8-quinolinolato)(3,5-dimethyl-phenolato)aluminum(III)

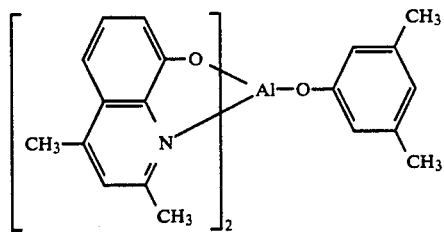

PC-23 Bis(2,4-dimethyl-8-quinolinolato)(3,5-di-tert-butylphenolato)aluminum(III)

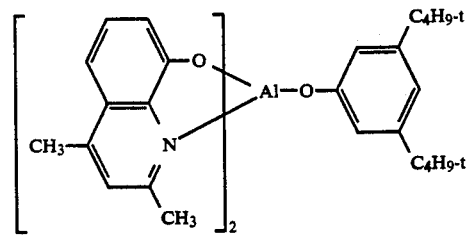

PC-24 Bis(2-methyl-4-ethyl-8-quinolinolato)(para-cresolato)aluminum(III)

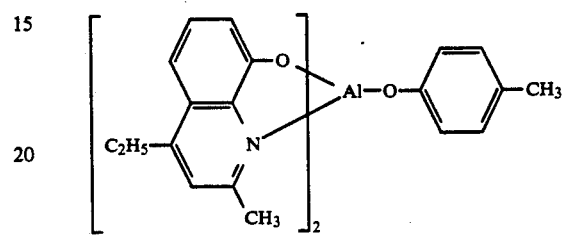

PC-26 Bis(2-methyl-4-methoxy-8-quinolinolato)-(para-phenylphenylato)aluminum(III)

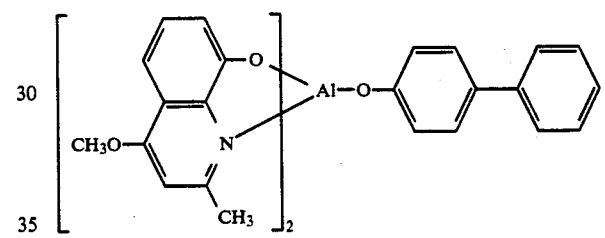

PC-26 Bis(2-methyl-5-cyano-8-quinolinolato)-(ortho-cresolato)aluminum(III)

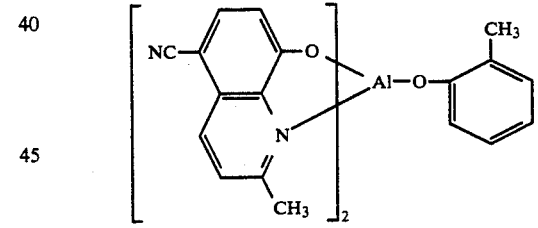

PC-27 Bis(2-methyl-6-trifluoromethyl-8-quinolinolato)-(2-naphtholato)aluminum(III)

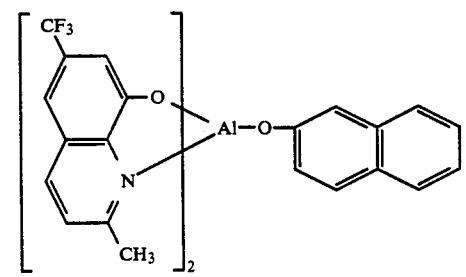

Instead of employing a bis($R^s$-8-quinolinolato)(-phenolato)aluminum(III)chelate for blue emission as described above it is alternatively contemplated to employ for the blue emitting luminescent layer a blue emitting bis($R^s$-8-quinolinolato)aluminum(III)-μ-oxobis($R^2$-8-quinolinolato)aluminum(III) compound. The use of these compounds in organic EL devices is taught by VanSlyke U.S. Pat. No. 5,151,629. These compounds broadly satisfy the formula:

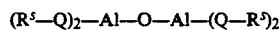

(XI)

and in a specific preferred form satisfy the formula:

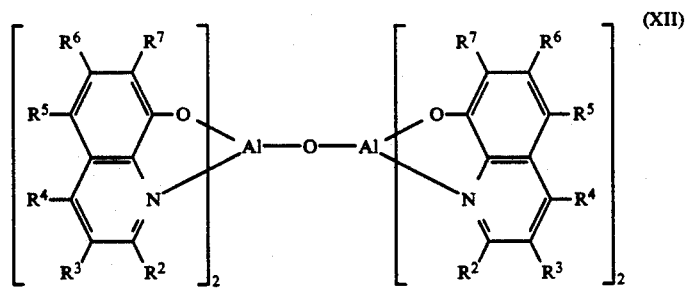

(XII)

where Q, $R^s$ and $R^2$ to $R^7$ are as previously described in connection with formulae VIII and X.

The following constitute specific examples of preferred compounds satisfying formulae XI and XII:

BA-1 Bis(2-methyl-8-quinolinolato)aluminum(III)-μ-oxo-bis(2-methyl-8-quinolinolato)aluminum(III)

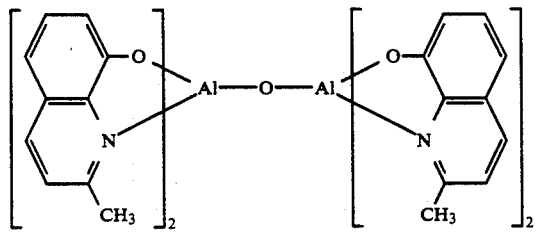

BA-2 Bis(2,4-dimethyl-8-quinolinolato)aluminum(III)-μ-oxo-bis(2,4-dimethyl-8-quinolinolato)-aluminum(III)

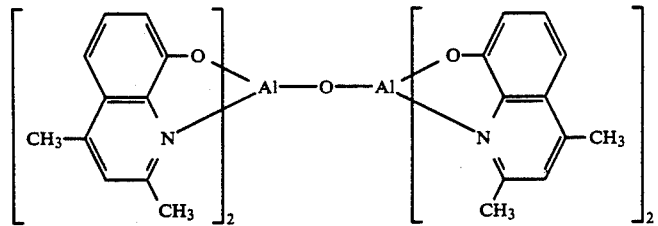

BA-3 Bis(4-ethyl-2-methyl-8-quinolinolato)aluminum(III)-μ-oxo-bis(4-ethyl-2-methyl-8-quinolinolato)-aluminum(III)

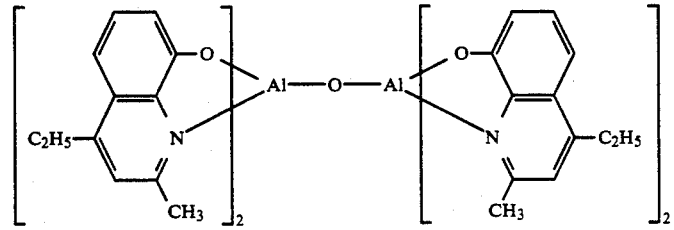

BA-4 Bis(2-methyl-4-methoxyquinolinoato)aluminum(III)-μ-oxo-bis(2-methyl-4-methoxyquinolinolato)-aluminum(III)

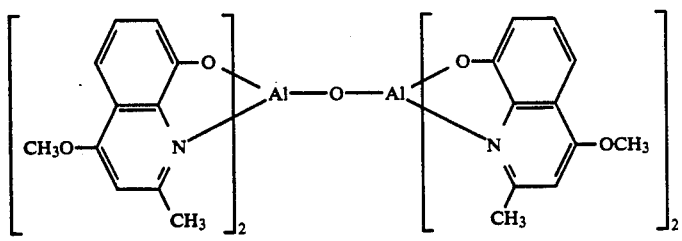

BA-5 Bis(5-cyano-2-methyl-8-quinolinolato)aluminum(III)-μ-oxo-bis(5-cyano-2-methyl-8-quinolinolato)aluminum(III)

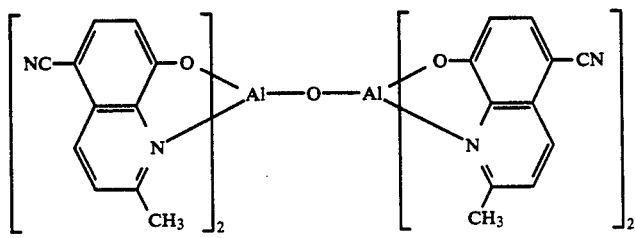

BA-6 Bis(2-methyl-5-trifluoromethyl-8-quinolinolato)aluminum(III)-μ-oxo-bis(2-methyl-5-trifluoro-methylquinolinolato)aluminum(III)

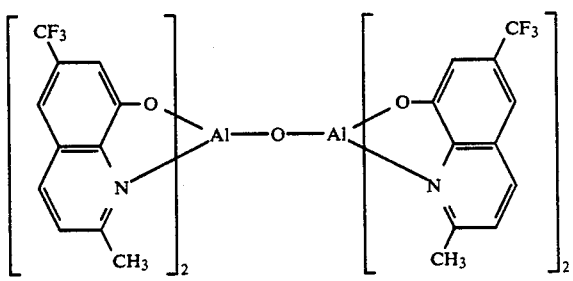

The luminescent layer in one set of sub-pixels can consist of any one or combination of the blue emitting compounds of formulae VIII to XII. Instead of employing the blue emitting compounds alone in the luminescent layer they can be employed as a host for a blue emitting fluorescent dye following the teachings of Tank et al U.S. Pat. No. 4,769,292, cited above, the disclosure of which is here incorporated by reference. Any blue emitting combination of one or more fluorescent dyes and one or more compounds satisfying any of formulae VIII to XII can be employed.

In one preferred form of the invention a blue emitting portion of the organic EL medium contains a formulae VIII to XII compound as a host and at least one blue emitting fluorescent dye containing a perylene or benzopyrene chromophoric unit. These chromophoric units require at least 5 fused carbocyclic aromatic rings and 20 carbon atoms in the aromatic rings. Additional fused rings do not detract from blue emission can be contained in the chromophoric unit. It is generally preferred to employ chromophoric units that contain from 20 to 40 ring carbon atoms.

The following is a listing of illustrative compounds contemplated for use as blue fluorescent dyes containing a perylene or benzopyrene chromophoric unit:

FD-1 Perylene

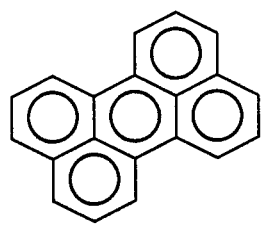

FD-2 Benzo[b]perylene

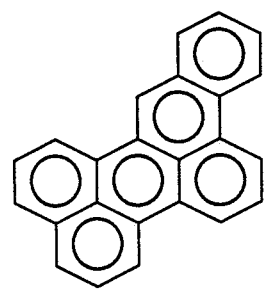

FD-3 Dibenzo[fg,ij]pentaphene

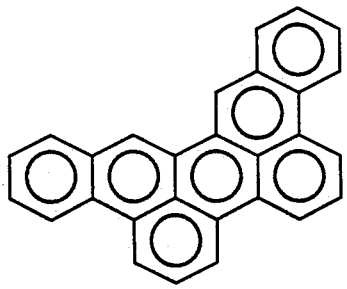

FD-4 Benzo[a]pyrene

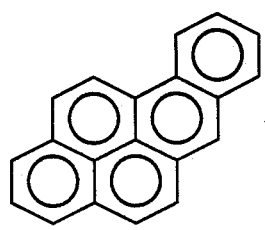

FD-5 Dibenzo[a,e]pyrene

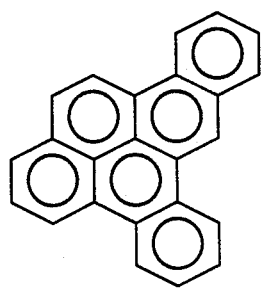

FD-6 Dibenzo[b,h]pyrene

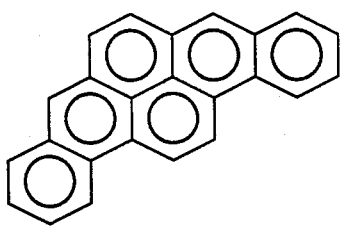

FD-7 Dibenzo[e,l]pyrene

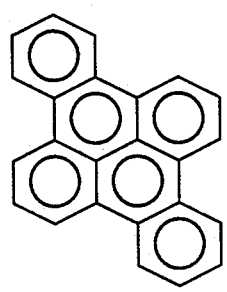

FD-8 Dibenzo[a,h]pyrene

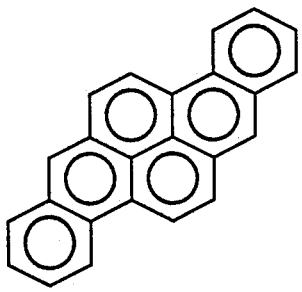

FD-9 Dibenzo[de,qr]naphthacene

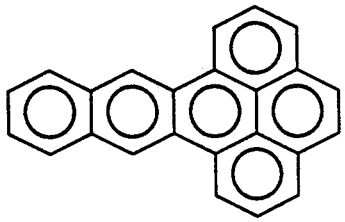

FD-10 Dibenzo[c,Mn]chrysene

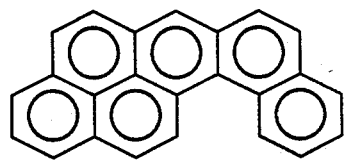

FD-11 Dibenzo[opq,stu]picene

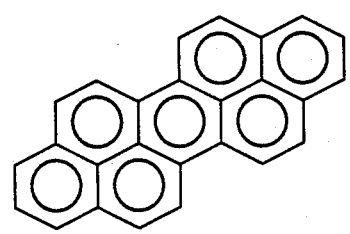

These aromatic ring compounds have the advantage that they can be deposited by vacuum vapor deposition, similarly as the other components of the organic medium. Since the aromatic compounds noted above represent chromophores in and of themselves, it is not necessary that other ring substituents be present. However, many dyes containing aromatic rings as chromophores are conventional, having been originally prepared for use in solution chemistry and therefore having substituents intended to modify solubility and, in some instances, hue. Various aromatic ring substituents of the types disclosed by Tang et al U.S. Pat. No. 4,769,292, cited above, are contemplated.

When one of the blue emitting aluminum chelates noted above is employed in forming a blue emitting luminescent layer, higher levels of efficiency are realized by having one of the oxinoid compounds of formula VII interposed between the blue emitting luminescent layer and the overlying second electrode. When the blue emitting layer corresponds to the first portion of the organic EL medium in the devices 100 and 200 or the first or second portion of the organic EL medium in the devices 300 and 400, this arrangement is satisfied. In other arrangements an additional layer can be deposited to keep the blue emitting aluminum chelates out of direct contact with an overlying second electrode.

The layers described above are capable of supplying the blue and green emissions required for full color imaging. To achieve the additional red emission from one set of sub-pixels required for full color imaging either or both of the preferred green and blue emitters described above can be combined with a conventional red emitting fluorescent dye. A preferred construction of this type is disclosed by Tang et al U.S. Pat. No. 4,769,292, cited above, the disclosure of which is here incorporated by reference.

An organic host material, preferably one of the green or blue emitting materials described above, is combined with a red emitting fluorescent dye. Although numerous red emitting fluorescent dyes are disclosed by Tang et al to be useful, it is specifically preferred to select red emitting fluorescent dyes from among fluorescent 4-dicyanomethylene-4H-pyrans and 4-dicyanomethylene-4H-thiopyrans, hereinafter referred to as fluorescent dicyanomethylene pyran and thiopyran dyes. Preferred fluorescent dyes of this class are those satisfying the following formula:

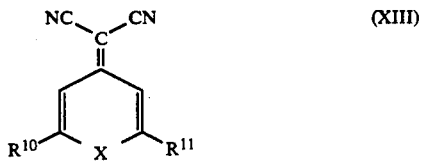

(XIII)

wherein

X represents oxygen or sulfur;

$R^{10}$ represents a 2-(4-aminostyryl) group; and $R^{11}$ represents a second $R^{10}$ group, an alkyl group, or an aryl group.

Although X most conveniently represents oxygen or sulfur, it is appreciated that higher atomic number chalcogens should provide similar, though bathochromically shifted, response. The amino group can be a primary, secondary or terially amino group. In one specifically preferred form the amino group can form at least one additional fused ring with the styryl phenyl ring. For example, the styryl phenyl ring and the amino group can form a five or six membered ring fused with the styryl phenyl ring. The alkyl group forming $R^{11}$ is preferably phenyl. When both $R^{10}$ and $R^{11}$ form a 2-(4-aminostyryl) group, the groups can be the same or different, but symmetrical compounds are more conveniently synthesized.

The following are illustrative fluorescent dicyanomethylenepyran and thiopyran dyes:

FD-12  4-(Dicyanomethylene)-2-methyl-6-(p-dimethylaminostyryl)-4H-pyran
FD-13  4-(Dicyanomethylene)-2-phenyl-6-[2-(9-julolidyl)ethenyl]-4H-pyran
FD-14  4-(Dicyanomethylene)-2,6-di[2-(9-julolidyl)ethenyl]-4H-pyran
FD-15  4-(Dicyanomethylene)-2-methyl-6-[2-(9-julolidyl)ethenyl]-4H-pyran
FD-16  4-(Dicyanomethylene)-2-methyl-6-[2-(9-julolidyl)ethenyl-4H-thiopyran As in the case of the blue emitting layers described above, more efficient performance is realized when the red emitting layer is separated from direct contact with the overlying second electrodes.

As taught by Tang et al, cited above, when a fluorescent dye is employed in combination with a host compound, the fluorescent dye is selected to bandgap no greater than that of the host and a reduction potential less negative than that of the host. Further, the host compound and the fluorescent dye combination are chosen so that they are spectrally coupled—that is, the host compound has a capability when used alone to emit at a wavelength that corresponds to an absorption wavelength of the fluorescent dye. For optimum coupling it is preferred that the peak emission wavelength of the host correspond to the peak absorption wavelength of the fluorescent dye within ±100 nm, optimally ±25 nm.

The fuorescent dyes can be incorporated in any convenient hue shifting amount. Tang et al, cited above, suggests concentrations in the range of from $10^{-3}$ to 10 mole percent, based on the combined amount of host and dye, but are preferably employed in the lower concentrations. Preferred fluorescent dye concentrations are in the range of from 0.05 to 5 (optimally 0.2 to 3) mole percent, based on the moles of fluorescent dye and host.

Although the second electrodes can be formed of any metal or metals (other than an alkali metal) having a lower (<4.0 eV) work function alone or in combination with one or more higher (>4.0 eV) work function metals, it is preferred that the second electrodes be constructed as taught by VanSlyke et al. U.S. Pat. No. 4,720,432, the disclosure of which is here incorporated by reference. In a specifically preferred construction the second electrodes at their interface with the organic EL medium contain at least 50 percent magnesium and at least 0.1 percent (optimally at least 1 percent) of a metal, such as silver or aluminum, having a work function greater than 4.0 eV. As noted above, after the metal has been deposited that forms an interface with the organic EL medium, the second electrodes can be thickened to increase their conductance without decreasing their electron injecting efficiency by depositing any convenient metal. When a higher (>4.0 eV) metal is employed for this purpose the stability of the second electrodes is also increased.

The invention has been described in terms of preferred embodiments in which both the organic EL medium and the second electrodes are formed in their desired patterned forms and therefore require no subsequent etching or material removal steps for patterning. Although not preferred, it is recognized that the material forming the second electrodes can be uniformly deposited over the organic EL medium and then patterned by conventional masking and etching techniques. When this approach is taken, the walls 105, 205, 305 and 405 can be omitted, since the sole function of these walls is to pattern the second electrodes. When the walls 205 or 405 are omitted, the walls 203 or 403a and 403b can be continuous walls joining all pixels and sub-pixels in the same column. Although all of the walls of devices 200 and 400 are preferably formed in a single fabrication and hence are preferably of the same height, it is recognized that the height relationship of the walls 205 to walls 203 or 405 to the walls 403a and 403b can be the same as the height relationship of walls 105 to walls 103.

Although pixels have been described as extending laterally between walls 103 in device 100, 203 in device 200, between walls 303a in device 300, and between walls 403a in device 400, it is appreciated that pixel boundaries have been selected for convenience of description. Alternatively, each pixel boundary can be viewed as being shifted laterally in each row by one sub-pixel. When the pixel boundaries are so viewed, each of the walls 103, 203, 303a and 403a are still located at sub-pixel boundaries, but not pixel boundaries; however, no actual change in the structure of the devices has occurred.

The invention has been described in detail with particular reference to preferred embodiments thereof, but it will be understood that variations and modifications can be effected within the spirit and scope of the invention.

What is claimed is:

1. A multicolor image display device comprised of an array consisting of
    a plurality of light emitting pixels arranged in two intersecting sets of parallel files, the pixels in a first set of parallel files forming columns and the pixels in a second set of parallel files forming rows on a common electrically insulative light transmissive support,
    the pixels in each file of one of said first set or said second set of parallel files containing and being joined by a common light transmissive first electrode means overlying said support,
    the first electrode means in adjacent files being laterally spaced on said support,
    an organic electroluminescent medium overlying the first electrode means and said support,
    the pixels in each file of the other of said first set or said second set of parallel files containing and being joined by a common second electrode means overlying said organic electroluminescent medium, and
    the second electrode means in adjacent files being laterally spaced on said organic electroluminescent medium,
    characterized in that the device is capable of producing multicolor image display,
    each pixel in said first set of parallel files of pixels is divided into at least two sub-pixels,
    said organic electroluminescent medium in each pixel in said first set forms at least two areas, each within one sub-pixel of each pixel in said first set and each capable of emitting light of a different hue,
    parallel walls are positioned between sub-pixels, said walls being of a height exceeding the thickness of the organic electroluminescent medium and capable of shadowing adjacent sub-pixels, and
    in said first set one of said first and second electrode means that is contained in and joins the pixels in each of the files of said first set is divided into at least two laterally spaced electrode elements each joining one sub-pixel of each of the pixels in a file.

2. A multicolor image display device according to claim 1 further characterized in that
    the first electrode means are arranged in parallel rows,
    each first electrode means joins and forms a part of all of the sub-pixels in a row,
    the second electrode means are arranged in parallel columns,
    each second electrode means is divided into at least two laterally spaced electrode elements,
    a first electrode element of each second electrode means joins and forms a part of one of the sub-pixels of all of the pixels in a column,
    a second electrode element of each second electrode means joins and forms a part of a second of the sub-pixels of all of the pixels in the same column, and
    a set of parallel walls overlying said first electrode means is positioned between adjacent columns of pixels, said walls being of a height exceeding the thickness of the organic electroluminescent medium and capable of shadowing adjacent sub-pixels.

3. A multicolor image display device according to claim 1 further characterized in that a second set of parallel walls of a height exceeding the thickness of the organic electroluminescent medium but less than that of the walls capable of shadowing adjacent sub-pixels is positioned between adjacent sub-pixels in each pixel of said first set.

4. A multicolor image display device according to claim 1 further characterized in that
    the second electrode means are arranged in parallel rows,
    each second electrode means joins and forms a part of all of the sub-pixels in a row,
    the first electrode means are arranged in parallel columns,
    each first electrode means is divided into at least two laterally spaced electrode elements,
    a first electrode element of each first electrode means joins and forms a part of one of the sub-pixels of all of the pixels in a column,
    a second electrode element of each first electrode means joins and forms a part of a second of the sub-pixels of all of the pixels in the same column, and
    the walls are laterally located between adjacent columns of pixels.

5. A multicolor image display device according to claim 4 further characterized in that a second set of parallel walls is provided, each located between adjacent rows of pixels, the walls that are located between adjacent columns of pixels are each laterally spaced from the walls of the second set, and the second electrode means in each row of pixels along one edge of the row overlies one of the walls of the second set and along the opposite edge of the row is laterally spaced from a second of the walls of the second set.

6. A multicolor image display device according to claim 1 further characterized in that the device has a full color display capability, each of the pixels in said first set of parallel files being divided into three sub-pixels, the organic electroluminescent medium in one of the sub-pixels in each pixel capable of emitting blue light, the organic electroluminescent medium in the second of the sub-pixels in each pixel capable of emitting green light, and the organic electroluminescent medium in the third of the sub-pixels in each pixel capable of emitting red light.

7. A multicolor image display device having full color capability according to claim 6 further characterized in that the organic electroluminescent medium capable of emitting blue light is comprised of a bis (8-quinolinolato)(phenolato)aluminum(III) chelate or a bis (8-quinolinolato)aluminum(III)---oxo-bis(8-quinolinolato)aluminum(III) chelate.

8. A multicolor image display device comprised of an array consisting of
    a plurality of light emitting pixels arranged in two intersecting sets of parallel files, the pixels in a first set of parallel files forming columns and the pixels in a second set of parallel files forming rows on a common electrically insulative light transmissive support, the pixels in each file of one of said first set or said second set of parallel files containing and being joined by a common light transmissive first electrode means overlying said support, the first electrode means in adjacent files being laterally spaced on said support, an organic electroluminescent medium overlying the first electrode means and said support, the pixels in each file of the other of said first set or said second set of parallel files containing and being joined by a common second electrode means overlying said organic electroluminescent medium, and the second electrode means in adjacent files being laterally spaced on said organic electroluminescent medium, characterized in that the light emitting device is capable of producing full color image display, each pixel in said first set of parallel files of pixels is divided into three sub-pixels, said organic electroluminescent medium in each pixel in said first set forms three areas, each within one sub-pixel of each pixel in said first set and each capable of emitting light of a different primary hue, a set of walls is positioned between adjacent files of pixels and between one of the sub-pixels in each of the pixels in each of the files and the two remaining sub-pixels in each of the pixels in each of the files, the walls each being of a height exceeding the thickness of the organic electroluminescent medium and capable of shadowing adjacent sub-pixels, and each electrode means of one of said first set or said second set of parallel files being divided into three laterally spaced electrode elements each joining one sub-pixels of each of the pixels in said first set or said second set of parallel files.

9. A multicolor image display device according to claim 8 further characterized in that the first electrode means are arranged in parallel rows, each first electrode means joins and forms a part of all of the sub-pixels in a row, the second electrode means are arranged in parallel columns, each second electrode means is divided into three laterally spaced electrode elements, a first electrode element of each second electrode means joins and forms a part of one of the sub-pixels of all of the pixels in a column, a second electrode element of each second electrode means joins and forms a part of the second of the sub-pixels of all of the pixels in the same column, a third electrode element of each second electrode means joins and form a part of the third of the sub-pixels of all of the pixels in the same column, and the walls are positioned between adjacent columns of pixels and between one of the sub-pixels and the two other sub-pixels in each of the pixels in each of the columns, the walls each being of a height exceeding the thickness of the organic electroluminescent medium and capable of shadowing adjacent sub-pixels.

10. A multicolor image display device according to claim 9 further characterized in that a second set of parallel walls of a height exceeding the thickness of the organic electroluminescent medium but less than that of the walls capable of shadowing adjacent sub-pixels is positioned between the two other sub-pixels in each pixel.

11. A multicolor image display device according to claim 8 further characterized in that the second electrode means are arranged in parallel rows, each second electrode means joins and forms a part of all of the sub-pixels in a row, the first electrode means are arranged in parallel columns, each first electrode means is divided into at least three laterally spaced electrode elements, a first electrode element of each first electrode means joins and forms a part of one of the sub-pixels of all of the pixels in a column, a second electrode element of each first electrode means joins and forms a part of the second of the sub-pixels of all of the pixels in the same column, a third electrode element of each first electrode means joins and forms a part of the third of the sub-pixels of all the pixels in the same column, and the walls are positioned between adjacent columns of pixels and between one of the sub-pixels and the two other sub-pixels in each of the pixels in each of the columns.

12. A multicolor image display device according to claim 11 further characterized in that a second set of parallel walls is provided, each located between adjacent rows of pixels, the walls that are located between columns are each laterally spaced from the walls of the second set, and the second electrode means in each row of pixels along one edge of the row overlies one of the walls of the second set and along the opposite edge of the row is laterally spaced from a second of the walls of the second set.

13. A multicolor image display device according to claim 8 further characterized in that the device has a full color display capability, each of the pixels in said first set of parallel files being divided into three sub-pixels, the organic electroluminescent medium in one of the sub-pixels in each pixel capable of emitting blue light, the organic electroluminescent medium in the second of the sub-pixels in each pixel, capable of emitting green light, and the organic electroluminescent medium in the third of the sub-pixels in each pixel capable of emitting red light.

14. A multicolor image display device according to claim 13 further characterized in that the organic electroluminescent medium capable of emitting blue light is comprised of a bis(quinolinolato)(phenolato)aluminum-(III) chelate or a bis(8-quinolinolato)aluminum--oxo-bis(8-quinolinolato)aluminum(III) chelate.

15. A multicolor image display device according to claim 14 further characterized in that the organic electroluminescent medium capable of emitting green light is comprised of an aluminum trisoxine and the aluminum trisoxine is interposed between the second electrode means and the organic electroluminescent medium capable of emitting blue light.

* * * * *